United States Patent
Li et al.

(10) Patent No.: US 8,620,629 B1
(45) Date of Patent: Dec. 31, 2013

(54) IDENTIFICATION AND SIMULATION OF MULTIPLE SUBGRAPHS IN MULTI-DOMAIN GRAPHICAL MODELING ENVIRONMENT

(75) Inventors: Wei Li, Framingham, MA (US); John Edward Ciolfi, Wellesley, MA (US); Michael I. Clune, Natick, MA (US)

(73) Assignee: The Mathworks, Inc., Natick, MA (US)

( * ) Notice: Subject to any disclaimer, the term of this patent is extended or adjusted under 35 U.S.C. 154(b) by 792 days.

(21) Appl. No.: 12/723,290

(22) Filed: Mar. 12, 2010

Related U.S. Application Data

(63) Continuation-in-part of application No. 11/024,148, filed on Dec. 21, 2004, now Pat. No. 7,925,477.

(60) Provisional application No. 60/611,571, filed on Sep. 20, 2004.

(51) Int. Cl.
  *G06F 17/50* (2006.01)
  *G06F 7/60* (2006.01)
  *G06G 7/48* (2006.01)

(52) U.S. Cl.
  USPC ...................................... 703/2; 703/1; 703/6

(58) Field of Classification Search
  USPC ........................................................... 703/2
  See application file for complete search history.

(56) References Cited

U.S. PATENT DOCUMENTS

| | | | |
|---|---|---|---|
| 4,985,860 A | 1/1991 | Vlach | |
| 5,301,301 A | 4/1994 | Kodosky et al. | |
| 6,983,227 B1 * | 1/2006 | Thalhammer-Reyero | 703/2 |
| 2001/0049595 A1 * | 12/2001 | Plumer et al. | 703/22 |
| 2002/0095276 A1 * | 7/2002 | Rong et al. | 703/2 |
| 2007/0171716 A1 * | 7/2007 | Wright et al. | 365/185.12 |
| 2010/0185984 A1 * | 7/2010 | Wright et al. | 715/833 |

OTHER PUBLICATIONS

Franck et al. "A Combined Continuous-Time/Discrete-Event Computation Model for Heterogeneous Simulation Systems", 2003.*
Fabian, Georgina. "A Language and Simulator for Hybrid Systems", 1999.*
Barton et al. "Modeling of Combined Discrete/Continuous Processes", Jun. 1994, vol. 40, No. 6.*
R. Sinha, V.C. Liang, C.J.J. Paredis, and P.K. Khosla, "Modeling and Simulation Methods for Design of Engineering Systems," to appear in Journal of Computing and Information Science in Engineering. vol. 1, pp. 84-91, 2001.*
van Beek et al. "Specification of Combined Continuous-Time/Discrete-Event Models", Modelling and Simulation 1996—Proceedings of the 1996 European Simulation Multiconference, Budapest, pp. 219-224.*
Liu, Jie. "Continuous Time and Mixed-Signal Simulation in Ptolemy II", Dec. 1998.*

(Continued)

*Primary Examiner* — Shambhavi Patel
(74) *Attorney, Agent, or Firm* — Harrity & Harrity, LLP

(57) ABSTRACT

A Discrete Event System model created or provided in a time domain modeling and simulation environment and/or an event domain modeling and simulation environment may be divided into multiple independent regions, e.g. "subgraphs", to achieve interleaved execution of the components from different domains. The subgraphs are automatically identified by the modeling and simulation environment during the compilation. Each subgraph consists of one or more interconnected event-driven components. Each subgraph is associated with an event calendar that controls the execution of the associated subgraph. Such multiple event calendar design enables multi-domain simulation, where event-driven components modeled by an event domain modeling environment and time-driven components modeled by a time domain modeling environment are simulated in an integrated fashion.

25 Claims, 19 Drawing Sheets

(56) References Cited

OTHER PUBLICATIONS

Anylogic User's Manual, XJ Technologies Company Ltd., 1992-2004; pp. 2-4, 8-9, 21-23, 41-43, 55-57, 155-156, 218-221, 270-271.
Bailey, Stephen A. et al., "1076.1 Ballot Resolution Committee, Comment Resolution Report," retrieved online at http://www.eda.org/vhdl-ams-ftp_files/lang_design/BRC/CRR15_Meta_issues.txt (2005).
Berkeley.edu, Ptolemy II Frequently Asked Questions, retrieved online at http://ptolemy.eecs.berkeley.edu/ptolemyII/ptIIfaq.htm (2005).
Boydstun, Frank et al., "New Perspectives Towards Modeling Depot MRO," Proceedings of the 2002 Winter Simulation Conference, vol. 1:738-746 (2002).
Charfi, F. et al., "Two Novel Modeling Methodologies for IGBT Transistor," IEEE 2002 28th Annual Conference of the IECON, vol. 1:550-554 (2002).
Chen, Gilbert et al., "Lookahead, Rollback and Lookback: Searching for Parallelism in Discrete Event Simulation," retrieved online at http://citeseer.ist.psu.edu/551717.html (2002).
Connell, Jon et al., "Early Hardware/Software Integration Using SystemC 2.0," retrieved online at http://www.synopsys.com/products/designware/system_studio/esc_paper_552.pdf (2002).
Dempsey, Mike, "Automatic translation of Simulink models into Modelica using Simelica and the AdvancedBlocks library," The Modelica Association, 11 pages (2003).
Deparade, André et al., "Integration and Synchronization of Discrete Formalisms and Continuous Models in Modelica," Proceedings of the 2002 IEEE International Conference no Control Applications, vol. 2:1189-1194 (2002).
Diamond, Bob et al., "EXTEND, User's Manual, Version 4, for Macintosh or Windows," Imagine That, Inc., (1997).
Dynasim AB, "Dymola, Dynamic Modeling Laboratory, User's Manual," Version 5.0, 39 pages, (1992-2002).
Fall, K. et al., "The ns manual (formerly ns notes and documentation)," The VINT Project, Chpts. 4-8, pp. 37-85, Chapt. 11, pp. 110-114 (2005).
Frey, Georg, "Simulation of Hybrid Systems Based on Interpreted Petri Nets," Proceedings of the IEEE International Conference on Simulation—Innovation Through Simulation, pp. 168-175 (1998).
Fujimoto, R., "Parallel discrete event simulation," Communications of the ACM, Oct. 1990: 1-8.
Grand Valley State University, "20. Sequential Function Charts," retrieved online at http://www.eod.gvsu.edu/~jackh/books/plcs/chapters/plc_sfc.pdf (2007).
Grötker, Thorsten, "SystemC, Transaction Level Modeling with SystemC," Synopsys, Inc., retrieved online at http://www-ti.informatik.uni-tuebingen.de/~systemc/Documents/Presentation-7-TLM_groetker.pdf, 28 pages, (2002).
Haverinen, Anssi et al., "White Paper for SystemC™ based SoC Communication Modeling for the OCP™ Protocol," retrieved online at http://www.ocpip.org/data/ocpip_wp_SystemC_Communication_Modeling_2002.pdf (2002).
Henricksson, D., et al., "TrueTime 1.2—Reference Manual," pp. 7-79 (2004).
Holz, E., "SDL-2000 Tutorial," Formal Methods Europa., pp. 1-49 (2001).
Hzeeland.nl, "Introduction to VHDL—A Tutorial," retrieved online at http://www.hzeeland.nl/~wrijker/dsy/vhdl/algemvhdl/fcmi/vhdlintro.html (2005).
Information Science Institute, "The Network Simulator—ns-2," retrieved online at http://www.isi.edu/nsnam/ns/ (2005).
International Engineering Consortium,"Specifications and Description Language (SDL)," retrieved online at http://www.iec.org/online/tutorials/acrobat/sdl.pdf (2005).
Lee, Jin-Shyan et al., "A Multi-Paradigm Modeling Approach for Hybrid Dynamic Systems," IEEE International Symposium on Computer Aided Control Systems Design, pp. 77-82 (2004).
Liu, J., et al., "Actor-oriented control system design: A Responsible framework perspective," IEEE Transactions on Control Systems Technology, vol. 12(2):250-62 (2004).
Liu, J., et al., "Component-based hierarchical modeling of systems with continuous and discrete dynamics," CACD'00, pp. 1-10 (2000).
Liu, J., et al. "Motivating hierarchical run-time models for measurement and control systems," Ptolemy Miniconference, Berkeley, CA, Mar. 22-23, 2001; 1-3.
Liu, J., et al., "System-level modeling of continuous and discrete dynamics," Ptolemy Miniconference, Berkeley, CA, Mar. 22-23, 2001; 1-4.
Mangeruca, Leonardo et al., "System Level Design for Embedded Controllers: Knock Detection, a Case Study in the Automotive Domain," Design, Automation and Test in Europe Conference and Exhibition, pp. 232-237 (2003).
Martin, D.E., et al., "Analysis and simulation of mixed-technology VLSI systems," Journal of Parallel and Distributed Computing, vol. 62:468-93 (2002).
Martin, R.C., "UML tutorial: Sequence diagrams," Engineering Notebook Column, Apr. 1998, 1-5.
MathWorks, "Stateflow and Stateflow Coder, for Complex Logic and State Diagram Modeling," User's Guide, Version 5, 896 pages (2003).
MathWorks, "Stateflow for Use with Simulink , User's Guide, Version 1," The MathWorks, Inc., 477 pages, (1998).
Mosterman, Pieter J. et al., "Modeling Petri Nets as Local Constraint Equations for Hybrid Systems Using Modelica™," retrieved online at http://citeseer.ist.psu.edu/359408.html (1998).
Mosterman, Pieter et al., "Panel Discussion: Challenges and Solution Techniques for Hybrid Simulation," retrieved online at: http://control.bu.edu/ieee/cdc04.cdc04sessions.html (2004).
Murata, T., "Petri nets: Properties, analysis and applications," Proceedings of the IEEE, vol. 77(4):541-80 (1989).
Music, G. et al., "Combined simulation for process control: extension of a general purpose simulation tool," Computers in Industry, vol. 38:79-92 (1999).
Naumann, Rolf, "Graphical design environment for CAMeL-Tools," http://wwwcs.uni-paderborn.de/SFB376/projects/c1/Paper/vcamel.html. Sep. 18-20, 1996; 1-10 (1996).
Opnet Technologies, Inc., "Modeler, Accelerating Network R&D," retrieved at www.opnet.com (2004).
Overhauser, D., et al., "Evaluating mixed-signal simulators," IEEE, pp. 113-120 (1995).
Overhauser, D., et al., "IDSIM2: An Environment for mixed-mode simulation," IEEE, vol. 5(2):1-4 (1990).
Perumalla, Kalyan et al., "Using reverse circuit execution for efficient parallel simulation of logic circuits," retrieved online at http://www.cc.gatech.edu/~kalyan/papers/rccircuit-spie02.pdf (2001).
Pimental, J.R., "A Data Model for Intelligent Automation Systems," IEEE International Workshop on Intelligent Robots and Systems, pp. 509-514 (1990).
Rensselaer Polytechnic Institute,"Parallel Discrete Event Simulation," retrieved online at http://www.rpi/edu/~gucluh/pdes.html (2005).
Rockwell Automation, "IEC 1131 Sequential Function Charts," retrieved online at http://www.software.rockwell.com/corporate/reference/Iec1131/sfc.cfm (2007).
Shamsuddin, Shuhaimi bin et al., "Design of Virtual Instrument for Radio Telemetry Station," Student Conference on Research and Development Proceedings, pp. 414-417 (2002).
Siegmund, Robert et al., "Efficient Modeling and Simulation of Data Communication Protocols in Communication-oriented Designs using the SystemCSV Extension," retrieved online at http://www-ti.informatik.uni-tuebingen.de/~systemc/Documents/Presentation-4-UP5_siegmund.pdf (2003).
SIMUL8 Corporation, "SIMUL8 Feature Tour," retrieved online at http://www.simul8.com/products/features/ (2005).
SIMUL8 Corporation, "SIMUL8 Professional—Normally $4995 but $3995 til May 31," retrieved online at http://simul8-online.com/products/s8prof.htm (2005).
System C Version 2.0 Users Guide, "Update for SystemC 2.0.1," 1996-2002, Chapter 1, pp. 1-8; Chapter 2, pp. 9-38; Chapter 5, pp. 71-82.

(56) References Cited

OTHER PUBLICATIONS

The Almagest, vol. 1—Ptolemy 0.7 User's Manual, Ptolemy, Mar. 3, 1997; Sections 1.4-1.9, 2.5-2.8, 4.9, 9.1-9.5, 12.1-12.4, 16.1, 16.3 (1997).

Vlach, M., "Modeling and simulation with Saber," IEEE, T-11.1-11.9 (1990).

Zeigler, B.P., et al., "Creating simulations in HLA/RTI using the DEVS modeling framework," DEVS/HLA Tutorial, 1-8 (1998).

European Search Report for Application No. 05798355.3-2224, 6 pages, dated Dec. 12, 2007.

International Search Report for Application No. PCT/US2005/033849, 9 pages, dated Aug. 1, 2006.

* cited by examiner

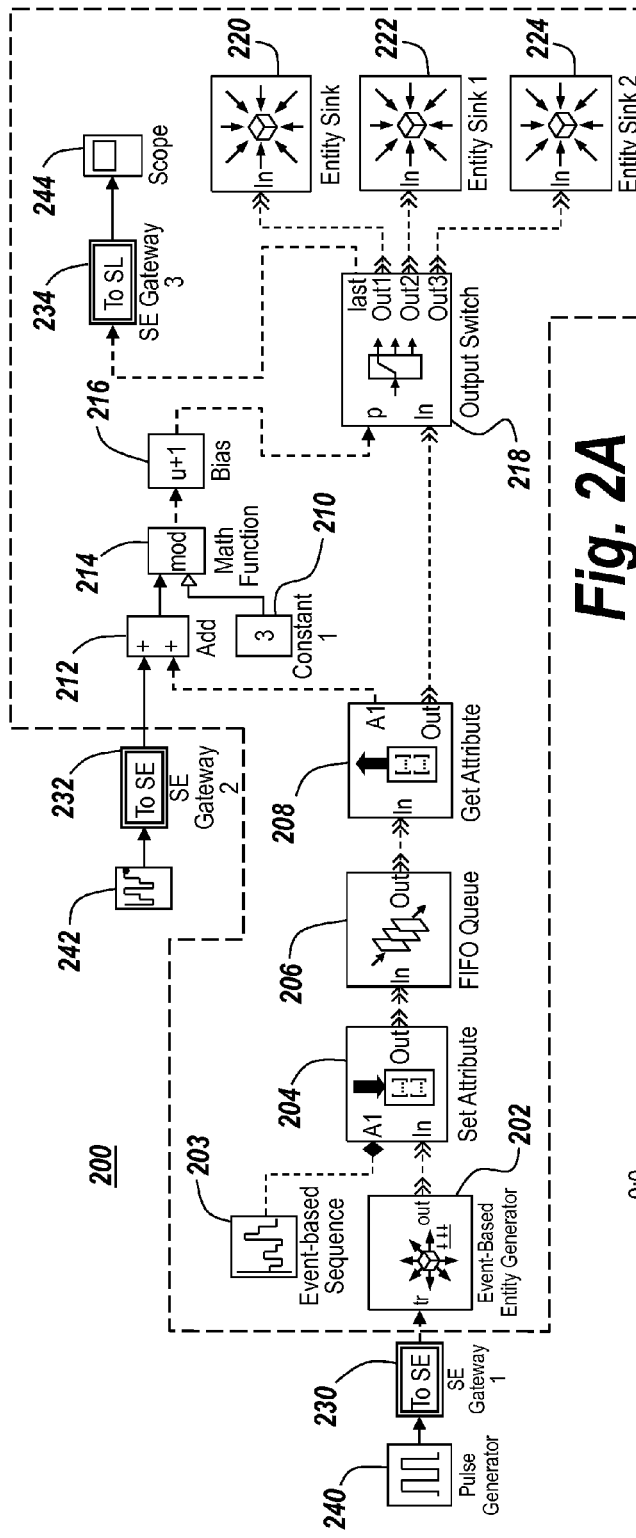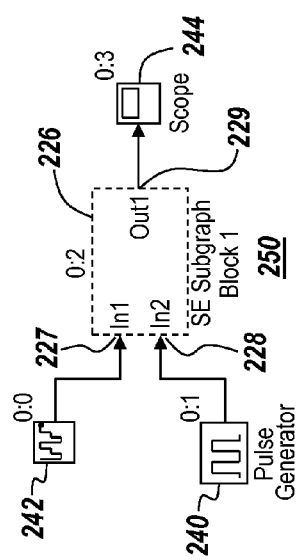
Fig. 2A
Fig. 2B

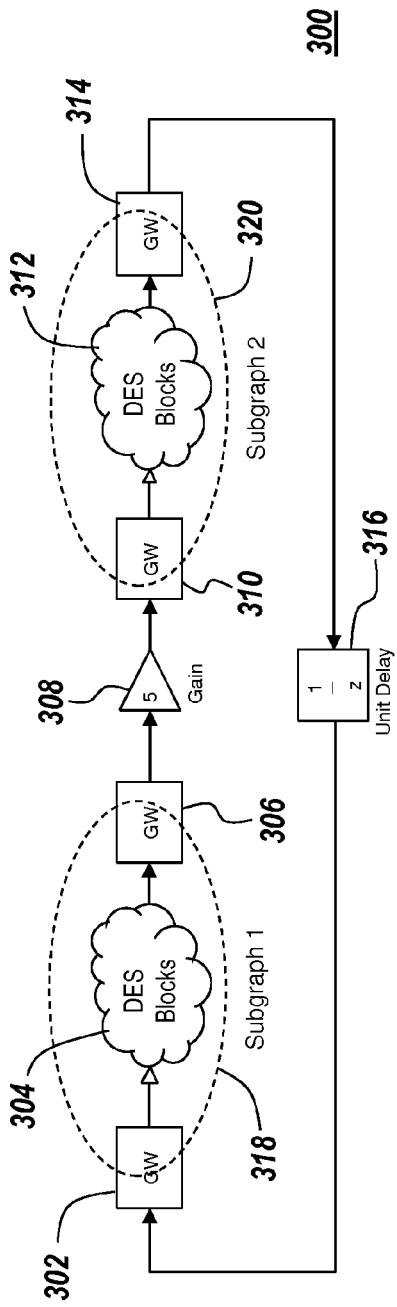
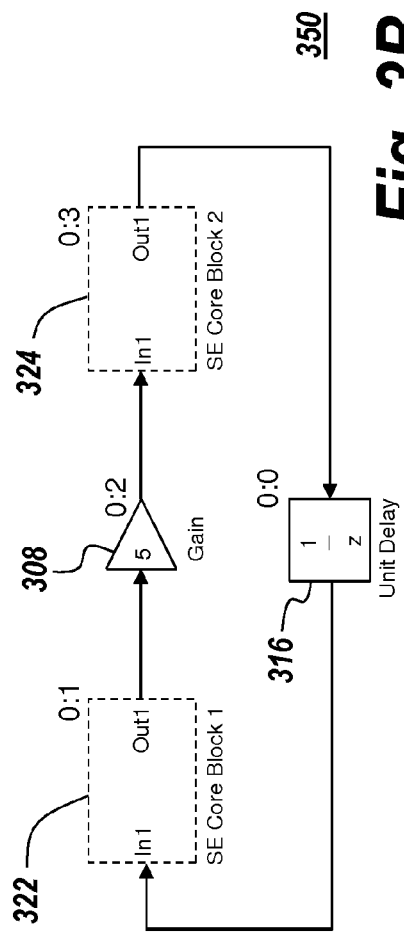
Fig. 3A
Fig. 3B

IDENTIFICATION AND SIMULATION OF MULTIPLE SUBGRAPHS IN MULTI-DOMAIN GRAPHICAL MODELING ENVIRONMENT

RELATED APPLICATIONS

The present application is a continuation in part of U.S. application Ser. No. 11/024,148, entitled "Method and System for Transferring Data Between a Discrete Event Environment and an External Environment," filed Dec. 21, 2004, which claims priority to U.S. Provisional Patent Application Ser. No. 60/611,571, entitled "Method and System for Transferring Data Between a Discrete Event Environment and an External Environment", filed Sep. 20, 2004, the contents of which are herein incorporated by reference.

BACKGROUND INFORMATION

A hybrid graphical model of a dynamic system may include one or more of graphical blocks from at least two different domains. For example, a hybrid Discrete Event System model may include time-driven components that may be modeled using a time domain modeling and simulation environment, e.g. Simulink®, and event-driven components that may be modeled using an event domain modeling and simulation environment, e.g. SimEvents®. Existing techniques provide a single event calendar for simulation of a hybrid Discrete Event System model, where all events scheduled by the model enter a common calendar for execution. The single event calendar processes the events scheduled by all event-driven components of the model before allowing other components, e.g. time-driven components, to execute. However, many models require the execution of some time-driven components in between the execution of event-driven components. Existing techniques do not support interleaved execution of multi-domain components of a hybrid Discrete Event System model.

In a prior art system, SimEvents® Version 3.0 from the MathWorks, Inc. that works with the time-driven block diagrams of Simulink®, there are blocks that execute in either the discrete event domain or the time domain. The execution paradigm of this framework consisted of collecting up all discrete event blocks and placing them at the end of a block sorted list. The execution engine would then run the block methods following the block sorted list order whereby the time-driven blocks would execute before all the discrete event blocks. This paradigm for modeling and simulation introduced data delays and other data consistency problems at the interaction of the two domains as defined by the signal lines. An additional problem that occurs with grouping all the discrete event blocks at the end of the sorted list is that only one event calendar is used. A single event calendar makes it impossible to correctly interleave the execution of time-driven blocks with discrete event based blocks, further causing inconsistencies in the simulation. In the prior art systems, because all blocks were grouped together, there was no need to demarcate the discrete event block from the time-based blocks, which hurts the readability of the block diagram. In the present application, the problems with the prior art system have been addressed by providing multiple subgraphs, demarcation of the subgraphs using gateways, and separate event calendars for each discrete event subgraph in the graphical model.

BRIEF DESCRIPTION OF THE DRAWINGS

The accompanying drawings, which are incorporated in and constitute a part of this specification, illustrate one or more embodiments of the invention and, together with the description, explain the invention. In the drawings.

FIG. 2A illustrates an exemplary multi-domain graphical model that includes gateway blocks;

FIG. 2B illustrates an exemplary transformed model that replaces the subgraph components with a subgraph block during compilation in accordance with an exemplary embodiment;

FIG. 3A illustrates an exemplary multi-domain graphical model that includes a plurality of subgraphs;

FIG. 3B illustrates an exemplary transformed graphical model corresponding to the multi-domain graphical model illustrated in FIG. 3A;

DETAILED DESCRIPTION

Figure 1A:
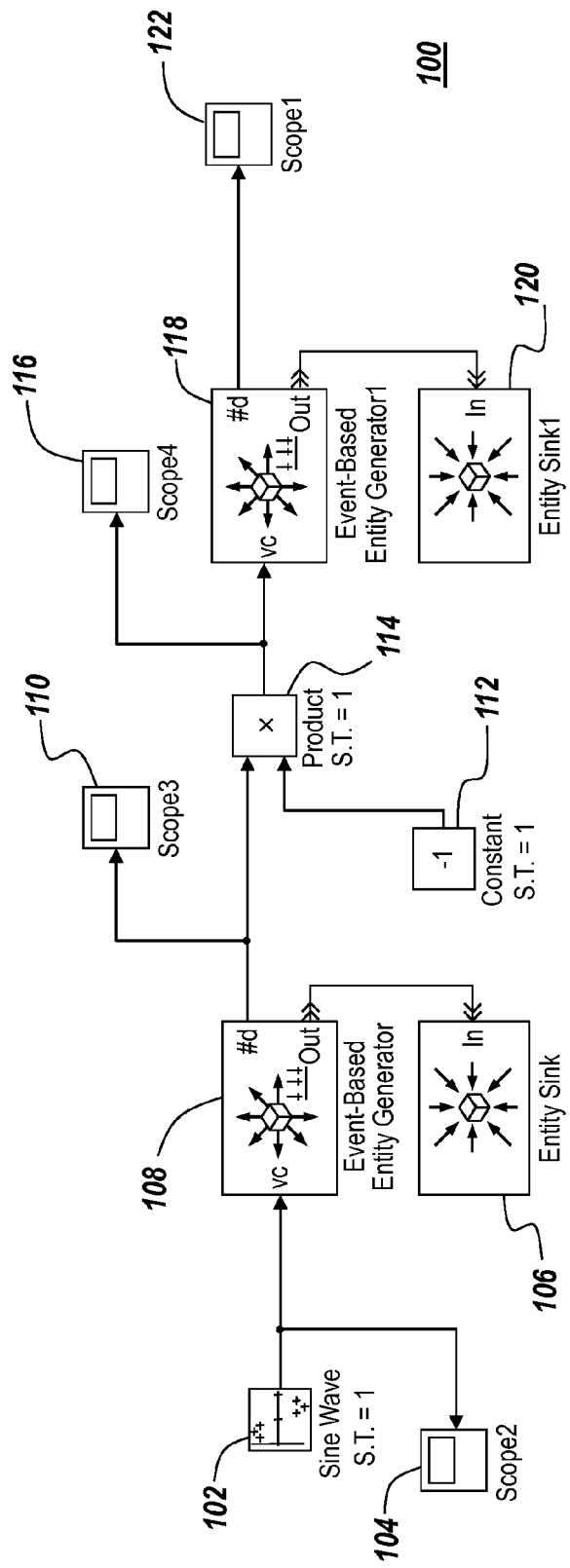
FIG. 1A illustrates an exemplary multi-domain graphical model including a plurality of time-driven components and a plurality of event-driven components.

Exemplary embodiments may enable a multi-domain graphical model to be partitioned into multiple subgraphs. For example, a model may include multiple time-driven components and multiple discrete event-driven components. In this example, the discrete event-driven components may be partitioned into subgraphs. The partitioning of the subgraphs is determined based upon block connectivity and not model hierarchy. Each subgraph has a separate event calendar for scheduling and executing events in the subgraph. The execution of the subgraphs may be interleaved with execution of the time-driven components allowing data dependency between components to be modeled. The use of separate event calendars avoids shortcomings associated with using a single event calendar for all discrete event-driven components in a graphical model. In addition, the use of multiple event calendars allows types of models to be build and executed that cannot be executed using conventional single event calendar techniques.

As used herein, a domain defines a set of execution semantics that are enforced during execution of the graphical model provided in that domain. For example, in an event domain, during the execution of an event-driven graphical model, the state transitions depend on asynchronous discrete incidents called events. As such, the execution semantics of an event-driven graphical model are controlled by the event occurrences. On the other hand, in a time domain, a time-driven graphical model is based on differential equations where time is an independent variable. As such, the execution semantics of a time-driven graphical model are controlled by elapsed time.

According to various embodiments of the present application, a subgraph is a group of interconnected components of the multi-domain graphical model that execute in one given domain. For example, an exemplary subgraph may include a plurality of interconnected components that all execute in an event-driven domain. The plurality of interconnected components of a subgraph may be consecutive components provided in the multi-domain graphical model. The subgraph may have an input and an output where the components of the subgraph execute using the input to generate the output of the subgraph. The input of the subgraph may be generated by a component from a different domain than that of the components of the subgraph. That is, the execution of the one or more subgraphs and the execution of the second domain components may be interleaved.

According to various embodiments, the first domain components and the second domain components may be provided at a same hierarchal level in a model hierarchy. A subgraph may include first domain components from a same hierarchical level. Alternatively, a subgraph may include first domain components from two different hierarchical levels such that the subgraph spans two different hierarchical levels in the model hierarchy.

A multi-domain graphical model may be created or provided in a time domain modeling and simulation environment, e.g. Simulink®, and/or an event domain modeling and simulation environment, e.g. SimEvents®. Exemplary embodiments are discussed in connection with executable graphical models created and executed in the Simulink® and SimEvents® environments. The illustrative embodiments will be described solely for illustrative purposes relative to a multi-domain graphical modeling environment provided by the software products from The MathWorks, Inc. of Natick, Mass. Although the illustrative embodiments will be described relative to a SimEvents® and/or Simulink®-based application, including the use of MATLAB®, one of ordinary skill in the art will appreciate that the illustrative embodiments may be applied to other event domain modeling and simulation environments and/or time domain modeling and simulation environments, such as any environment using software products of LabVIEW® or MATRIXx from National Instruments, Inc., MSC.Adams® from MSC.Software Corporation of Santa Ana, Calif., Virtuoso from Cadence of San Jose, Calif., Dymola from Dynasim AB of Lund, Sweden, Rational Rose from IBM of White Plains, N.Y., Mathematica® from Wolfram Research, Inc. of Champaign, Ill., Mathcad from Mathsoft Engineering & Education Inc., or Maple™ from Maplesoft, a division of Waterloo Maple Inc.

The multi-domain graphical model may be divided into multiple independent regions referred as "subgraphs" to achieve interleaved execution of the components from different domains. The subgraphs are automatically identified by the modeling and simulation environment during the compilation stage. Each subgraph includes one or more interconnected event-driven components. Each subgraph is associated with an event calendar that controls the execution of the associated subgraph. Such multiple event calendar design enables multi-domain simulation, where event-driven components modeled by an event domain modeling environment and time-driven components modeled by a time domain modeling environment are simulated in an integrated fashion. During the execution of the multi-domain graphical model, the event-driven components and the time-driven components may exchange data. Data exchanges occur when one component interfaces with another.

In accordance with various embodiments of the present application, a multi-domain graphical model may include a plurality of time-driven components and a plurality of event-driven components. An exemplary multi-domain graphical model is illustrated in FIG. 1A. Multi-domain graphical model 100 illustrated in FIG. 1A includes a plurality of time-driven components 112, 114 that execute in a time domain and a plurality of event-driven components 106, 108, 118, 120 that execute in an event domain. Each of the time-driven components 112, 114 and the event-driven components 106, 108, 118, 120 has at least one input and one output. An overview of the various components of multi-domain graphical model 100 is provided below.

Event-driven components 106, 108, 118, 120 in this example are Discrete Event System (DES) components. The execution of a DES component is driven by asynchronous discrete incidents called events. Such a model execution differs greatly from execution of a model in the time domain modeling and simulation environment, where the execution of the model is time driven.

A primary data component within the exemplary DES components described herein is an "entity". An entity is an item that passes from component to component in the DES modeling environment. For example, when modeling a digital network, an entity may represent a data packet. In another example, when modeling a manufacturing plant, entities may take the form of individual items on the assembly line.

DES components are interconnected using block connectors that pass entities and other information between components. The information may include information from other models or data sources or references that have some contribution to the creation or operation of the entities as they pass through the DES components. The components may also have block connectors that pass information out to other models or data sources outside of the DES model. In accordance with various embodiments, DES components may be graphically illustrated with graphical cues such as line style and port style to graphically indicate the types of interaction between the components.

The basic operation of the DES components involves passing the entities through the components according to instructions in each of the components. The exact sequencing of operations within these components is governed by an event calendar. The event calendar serves to drive the DES components forward by triggering the execution of the next scheduled event in the event calendar. A multi-domain simulation solver may allow for the execution of events in the DES event calendar in light of operations that occur in an external environment. The solver is a component of the modeling and simulation environment that determines the next simulation step. The solver may be in communication with the external environment and may notify the external environment of events within the DES environment which may affect the states of the external environment. During the simulation of DES components, the simulation clock is advanced to the next event time with no state changes until the execution of the next event. As such, the simulation of the DES components, future events are not known until the current events are completed.

With reference again to multi-domain graphical model 100, sine wave generator block 102 provides an input to event-driven entity generator 108. The output of sine wave generator block 102 is plotted on a display using scope block 104. The entity generator block 108 has two output ports: one event output port "OUT" and one signal output port "#d". The entities that are generated by entity generator block 108 are output at the event output port "OUT" of entity generator block 108. The entities generated by entity generator block 108 are sent to entity sink 106. The output of entity generator 108 provided at its signal output port "#d" is sent as an input to the time-driven product block 114. The output of the event-driven entity generator 108 provided at the signal output port "#d" is also plotted on a display using scope block 110.

Product block 114 multiples the values of the signals provided at its input ports, i.e. the signal output of entity generator 108 and the value of the constant generated by constant block 112. The output of product block 104, i.e. the product of the signal output of the entity generator 108 and the value of the signal generated by constant block 112, is plotted on a display using scope block 116. The output of product block 114 is also sent to the input port of entity generator block 118. The entities that are generated by entity generator block 118 are output at the event output port "OUT" of entity generator block 118. The entities generated by entity generator block 118 are sent to entity sink 120. The output of entity generator block 118 provided at the signal output port "#d" is plotted on a display using scope block 122.

According to various embodiments, time-driven components 112, 114 and event-driven components 106, 108, 118, 120 of multi-domain graphical model 100 may be provided at a same level of a hierarchical structure. Hierarchy in graphical models is typically captured by subsystems. A subsystem is a group of graphical components that define an element of the system being modeled. The subsystems comprise primitive components and/or additional subsystems. Because subsystems may contain other subsystems, a mechanism exists for hierarchically structuring the graphical model. The modeling and simulation environment may create several hierarchies of components where the output of the components provided at a first level of the hierarchical structure may be an input to the components provided at a second level of the hierarchical structure. The subgraphs may span multiple levels of subsystem hierarchy.

A traditional discrete-event simulation event calendar design, i.e. a single event calendar design, cannot fully satisfy the data dependency requirements in the multi-domain graphical model 100 illustrated in FIG. 1A. The multi-domain graphical model 100 includes a plurality of time-driven components 112, 114 provided between a first set of event-driven components 106, 108 and a second set of event-driven components 118, 120. A single event calendar design is unable to interleave the execution of time-driven components 112, 114 in between the execution of discrete event-driven components 106, 108, 118, 120. In discrete-event simulation, the processing of one event often triggers other events, which may occur immediately or after a delay.

An event calendar is used to sequence the events according to simulation time and priority. When a single event calendar is used to sequence the events, only the event triggers are considered, i.e. the input provided by time-driven components are not accounted for. Accordingly, if a single event calendar is used for multi-domain graphical model 100 illustrated in FIG. 1A, entity generator 118 will be scheduled to execute based on the occurrence of other events and will not be able to use the output of the time-driven product block 114 during execution. However, if multiple event calendars are used to schedule the execution of the first set of event-driven components 106, 108 and the execution of the second set of event-driven components 118, 120, respectively, the second set of event-driven components 118, 120 may use the output of the time-driven product block 114 during execution.

Figure 1B:
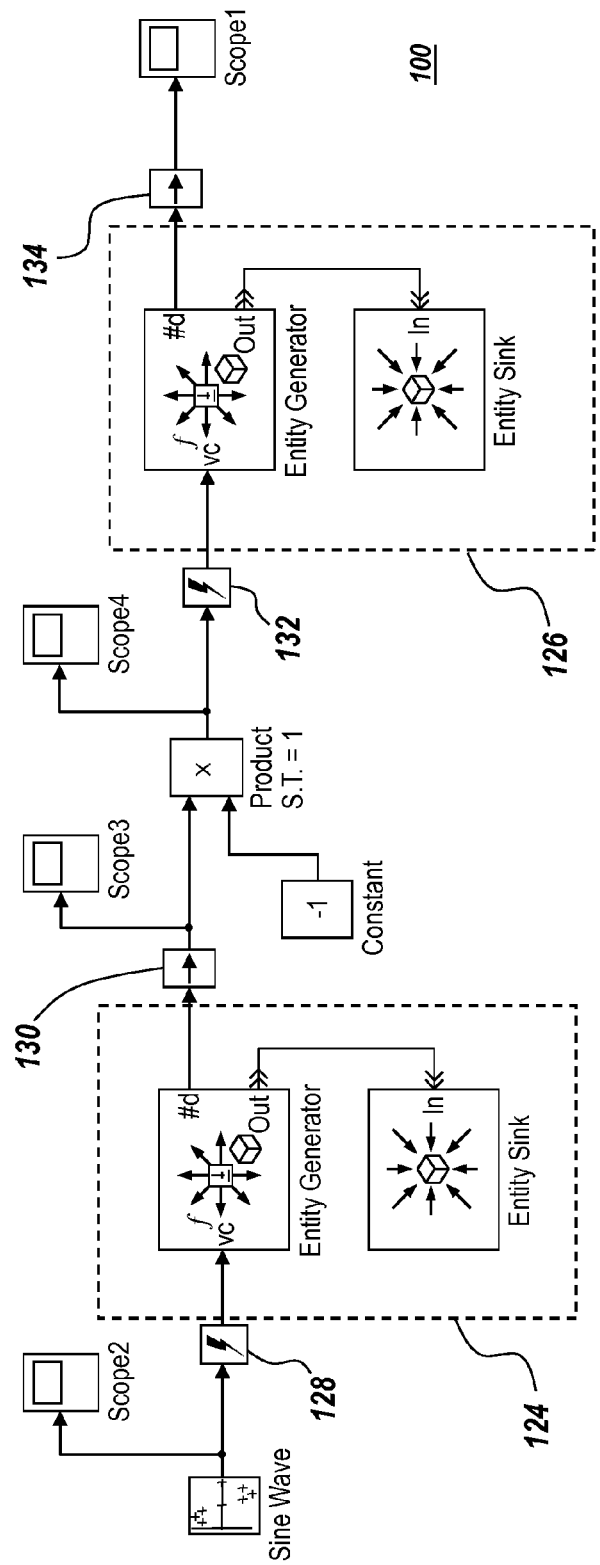
FIG. 1B illustrates two exemplary subgraphs identified on the multi-domain graphical model of FIG. 1A in accordance with exemplary embodiments.

It is possible to apply the multiple event calendar approach to multi-domain graphical model 100 illustrated in FIG. 1A. For example, the first set of event-driven components 106, 108 may be identified as first subgraph 124, as illustrated in FIG. 1B. The second set of event-driven components 118, 120 may be identified as second subgraph 126, as further illustrated in FIG. 1B. Then, a first event calendar may be assigned to first subgraph 124 and a second event calendar, independent from the first event calendar, may be assigned to second subgraph 126 such that the two subgraphs leverage two independent discrete-event calendars. The multiple event calendar design allows interleaved executions of time-driven components 112, 114 and event-driven components 106, 108, 118, 120 such that the data dependency requirements are satisfied.

As illustrated in FIG. 1B, second subgraph 126 requires computation results at the output of time-driven "Product" block 114 during execution. However, if first subgraph 124 and second subgraph 126 are executed as atomic units using a single event calendar, it is impossible for the time domain modeling environment to update "Product" block 114 using new inputs generated by first subgraph 124, and produce output for the execution of second subgraph 126 which is controlled by the event domain modeling environment. The multiple event calendar approach allows updating "Product" block 114 with new inputs generated by first subgraph 124. The multiple event calendar approach also allows second subgraph 126 to use the computation results at the output of "Product" block 114 during execution.

In order to understand how the partitioning into subgraphs is achieved, it is helpful to better understand some background on how modeling is done. Modeling of a multi-domain graphical model can include four stages: editing, compiling, linking, and execution, i.e. simulation. During the editing stage, the multi-domain graphical model is generated using one or more first domain components and one or more second domain components in the multi-domain graphical modeling and simulation environment. The components are interconnected to indicate information exchange therebetween. During the compiling and linking the multi-domain graphical model, an "in-memory executable" version of the model is produced. The in-memory executable version of the model is used for generating code and simulating the multi-domain graphical model.

The compiling stage involves checking the integrity and validity of the interconnections of the components of the multi-domain graphical model. In the linking stage, the result of the compiling stage is used to allocate memory needed for the execution of the various components of the multi-domain graphical model. After linking is performed, code may be generated for the multi-domain graphical model. Executing the code in the computing device is referred as executing or simulating the multi-domain graphical model.

The boundaries of the first subgraph 124 and the second subgraph 126 are automatically determined by the modeling and simulation environment during the compilation of the multi-domain graphical model, i.e. before the simulation of the multi-domain graphical model starts. The boundaries of the subgraphs may be identified using graphical components such as gateway blocks provided in the multi-domain graphical model. The gateway blocks serve as markers that mark the borders between domains. Alternatively, the boundaries of the subgraphs may be identified based on port properties of the components of the multi-domain graphical components. These techniques for determining boundaries will be described in more detail below. One of ordinary skill in the art will appreciate that other methods may be used to identify boundaries of subgraphs, including but not limited to, user inputs, code constructs and search algorithms.

In accordance with one exemplary embodiment, the modeling and simulation environment may use graphical components, such as gateway blocks 128, 130, 132, 134, to indicate the boundaries of the identified subgraphs. The gateway blocks may be delimiter blocks that do not perform any functionality other than indicating a specific location on the multi-domain graphical model. The modeling and simulation environment may use a search algorithm to determine the location of the gateway blocks 128, 130, 132, 134. Upon locating the gateway blocks, the modeling and simulation environment may automatically identify the subgraphs without requiring an input from a user regarding the boundaries of the subgraphs. Alternatively, the user may insert the gateway blocks 128, 130, 132, 134 during the editing stage of the multi-domain graphical model to indicate domain crossing during execution for syntactical clarity. However, the gateway blocks are not required for the automatic identification of the subgraphs 124, 126. According to various embodiments, the gateways blocks 128, 130, 132, 134 may be invisible to the user, i.e. may not be displayed along with the rest of the multi-domain graphical model.

In one illustrative embodiment, the modeling and simulation environment may start analyzing the components of a multi-domain graphical model to determine whether the components are gateways blocks or any other components that indicate the boundary of a subgraph. The modeling and simulation environment may use a search algorithm to analyze the components. The search algorithm can start the analysis at any component within the multi-domain graphical model. The search algorithm traverses each neighboring component. When the search algorithm reaches a block that does not execute in a given domain, e.g. the event domain, the search stops and a first subgraph is identified. The modeling and simulation environment repeats the search algorithm until all the components of the multi-domain graphical model is analyzed. The search algorithm is explained in detail below in connection with FIGS. 5A-5B.

According to one exemplary embodiment, the search algorithm may process the multi-domain graphical domain to form a tree structure. The search algorithm may create a tree of nodes in which the original component where the search has started becomes the root node. The search process may add components to the tree, until the search reaches a gateway block, at which point the search stops for that branch of the tree. The gateway blocks become the leaf nodes in the tree. If the search hits a component that is already on the tree, the search stops to avoid recursion. After the search has traversed all the components of the multi-domain graphical model, the search is deemed to be complete.

In accordance with one exemplary embodiment, the modeling and simulation environment may use the port, block, subsystem and/or model properties of the components of the multi-domain graphical model to identify the boundaries of a subgraph. The components of a multi-domain graphical model have input and output ports. The properties associated with these ports, blocks, subsystems and/or models indicate whether the block executes in a time domain, event domain and/or both. Based on this analysis, the modeling and simulation environment identifies whether a block of the multi-domain graphical model may be included in a subgraph. The modeling and simulation environment may use a search algorithm similar to that described above to analyze the port properties of the components.

For example, in FIG. 1B, gateway block 128 designates the input of the first subgraph 124 and gateway block 130 designates the output of the first subgraph 124. As such, the event-domain modeling and simulation environment assumes control over the simulation of multi-domain graphical model 100 when gateway block 128 is encountered. Similarly, the time-domain modeling and simulation environment may assume control over the simulation of multi-domain graphical model 100 when gateway block 130 is encountered.

As further illustrated in FIG. 1B, gateway block 132 designates the input of the second subgraph 126 and gateway block 134 designates the output of the second subgraph 126. As such, the event-domain modeling and simulation environment may assume control over the simulation of multi-domain graphical model 100 when gateway block 132 is encountered. Similarly, the time-domain modeling and simulation environment may assume control over the simulation of multi-domain graphical model 100 when gateway block 134 is encountered.

Figure 1C:
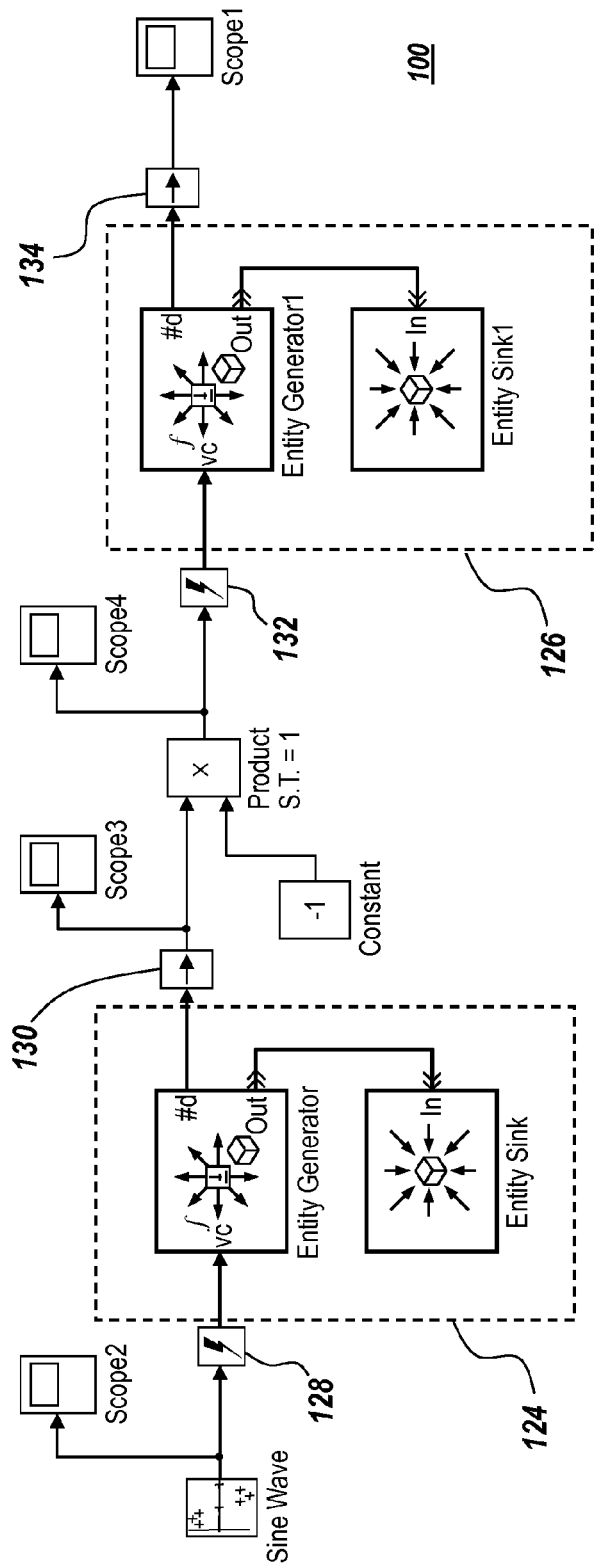
FIGS. 1C-1D illustrate visual cues used to illustrate the two exemplary subgraphs of FIG. 1B in accordance with exemplary embodiments.
Figure 1D:
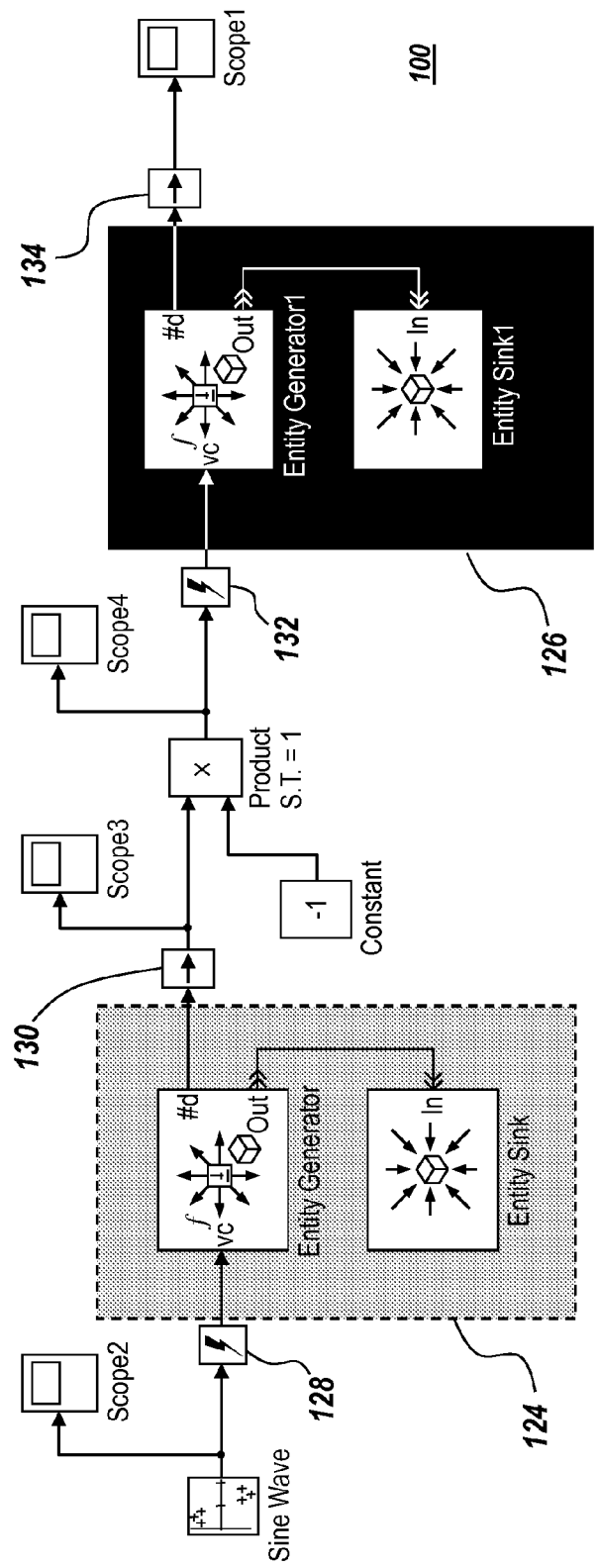

Visual cues may be displayed to specify where subgraphs are located in the multi-domain graphical model. For example, the elements of a subgraph may be color-coded, i.e. illustrated with a same color. As illustrated in FIG. 1C, the elements of a subgraph may also be identified using different line styles to illustrate the elements. As further illustrated in FIG. 1D, a separate color may be associated with each subgraph in a multi-domain graphical model. Alternatively, a label or annotation may be provided near elements of an identified subgraph. One of ordinary skill in the art will appreciate that the above discussed visual cues are for illustrative purposes and other visual cues may be used, alone or in connection with those provided above, to visually distinguish the subgraphs from the remainder of the graphical model. The visual cues may be incorporated into the multi-domain graphical model during the editing, compiling and/or executing stage of the modeling process.

The modeling and simulation environment groups as many elements as possible into a subgraph by including all consecutive interconnected components of a multi-domain graphical model that may execute in the first domain in the subgraph. For example, all consecutive, interconnected components of a multi-domain graphical model that may execute in an event domain are grouped as a first subgraph. Accordingly, the modeling and simulation environment partitions the multi-domain graphical model into as few subgraphs as possible to decrease the number of subgraphs in the multi-domain graphical model. In doing so, the modeling and simulation environment minimizes the crossing between domains during the execution of the multi-domain graphical model.

FIG. 2A illustrates a multi-domain graphical model 200 that includes event-driven components 202, 203, 204, 206, 208, 218, 220, 222, 224 and polymorphic components 210, 212, 214, 216. A polymorphic component or a polymorphic block can execute in a plurality of domains. For example, polymorphic components 210, 212, 214, 216 may act as time-driven components and execute in a time domain. Alternatively, polymorphic components 210, 212, 214, 216 may act as event-driven components and execute in an event domain. In FIG. 2A, the modeling and simulation environment groups polymorphic components 210, 212, 214, 216 along with event-driven components 202, 203, 204, 206, 208, 218, 220, 222, 224 to decrease the number of subgraphs. This grouping is also illustrated by gateway blocks 230, 232, 234. The gateway blocks indicate the boundaries for a single subgraph. Gateway blocks 230, 232 provided after each time-driven source block 240, 242 indicate a crossing to the event domain. Gateway block 234 provided at the output of the multi-domain graphical model indicates a crossing to the time domain to display the output on a scope block 244. As such, multi-domain graphical model 200 illustrated in FIG. 2A is compiled using a single subgraph.

The identified subgraphs may be replaced with a subgraph block in the compiled blocks list. The compiled block list is the list of blocks that executes in time-driven modeling and simulation environment. The compiled blocks list is not visible to the user. During compilation of the multi-domain graphical model, the modeling and simulation environment replaces the components identified as the subgraph with a subgraph block and generates a transformed graphical model.

The modeling and simulation environment treats the multi-domain graphical model 200 illustrated in FIG. 2A as the transformed graphical model 250 illustrated in FIG. 2B during simulation. Transformed graphical model 250 has a single subgraph block 226 that represents event-driven components 202, 203, 204, 206, 208, 218, 220, 222, 224 and polymorphic components 210, 212, 214, 216 of multi-domain graphical model 200 illustrated in FIG. 2A. Each time-domain-to-event-domain gateway 230, 232 is represented by an input port 227, 228 on the subgraph block 226. Each event-domain-to-time-domain gateway 234 is represented by an output port 229 on the subgraph block 226.

If the user tries to include a time-driven component in a DES subgraph, the modeling and simulation environment may generate an error message. The modeling and simulation environment may identify the error when the modeling and simulation environment identifies the boundaries of the subgraphs. For example, the modeling and simulation environment may encounter a first gateway block that indicates the input of a subgraph using the search algorithm as described above. If the modeling and simulation environment encounters a time-driven component among event-driven components before the search algorithm finds a second gateway block, the modeling and simulation environment may generate the error message. When such an error is identified, the modeling and simulation environment may automatically correct the error by removing the component that does not belong to the subgraph. In the foregoing example, the modeling and simulation environment may insert a second gateway block before the time-driven component and continue the analysis of the remainder of the multi-domain graphical model. Alternatively, the modeling and simulation environment may provide an error message to the user and request the user to remove the time-driven component from the subgraph or insert a gateway block before the time-driven component to indicate the boundaries of the first subgraph.

Figure 2C:
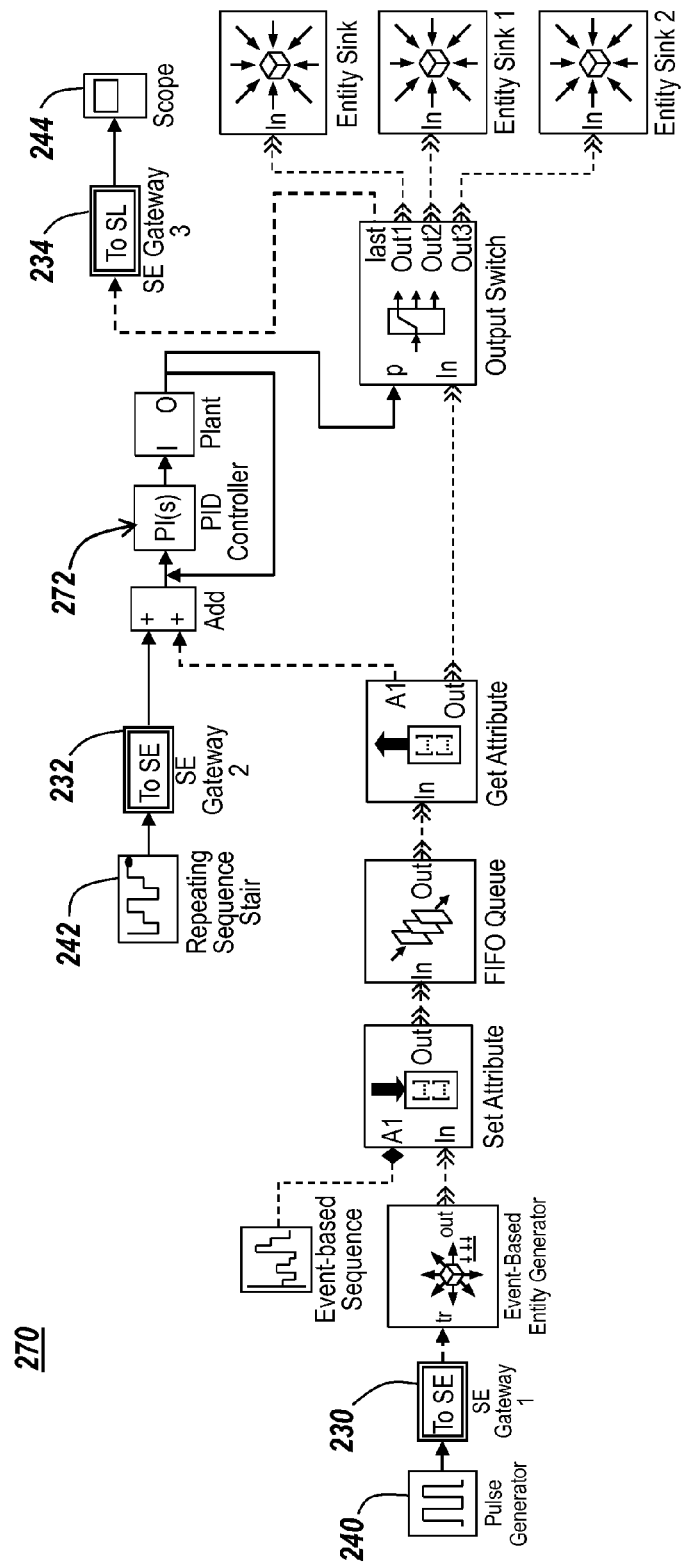
FIG. 2C illustrates an exemplary multi-domain graphical model that includes an erroneous partitioning.
Figure 2D:
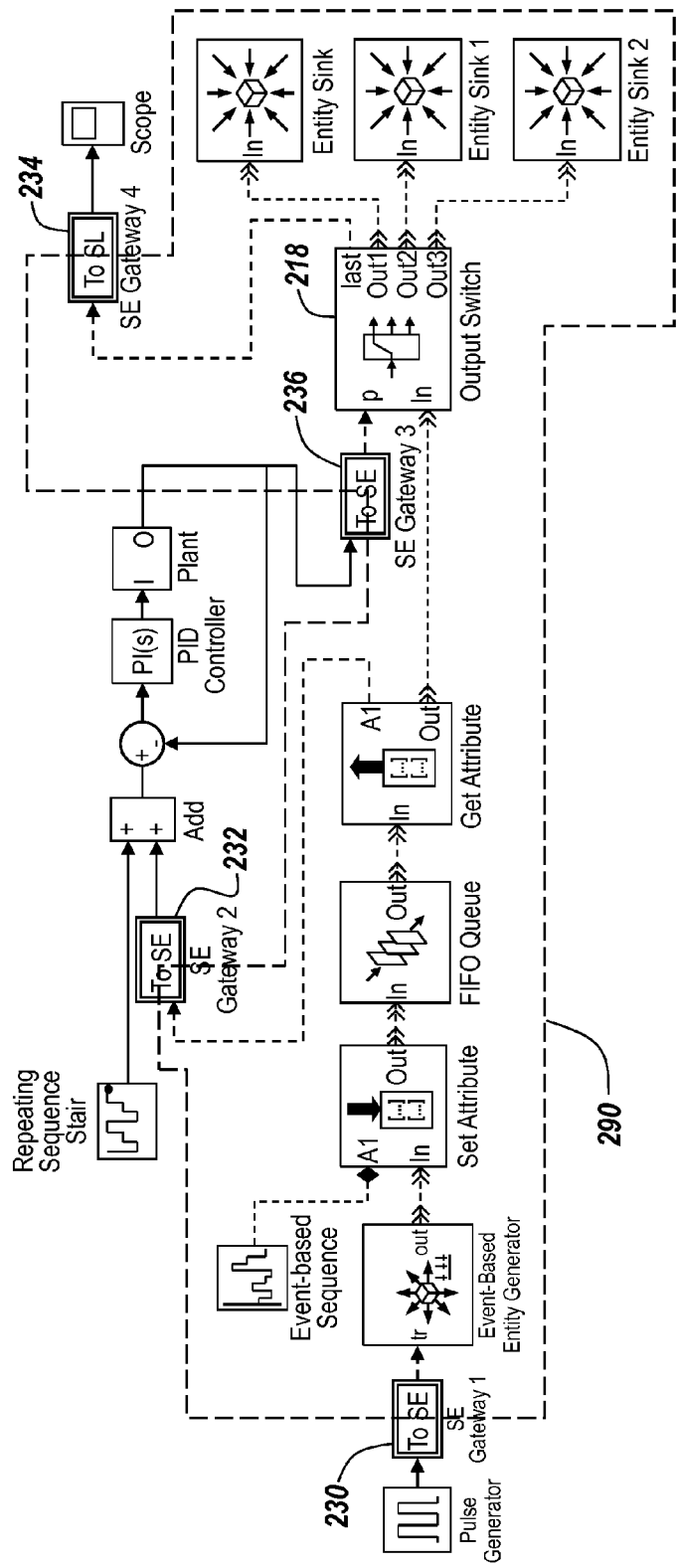
FIG. 2D illustrates the corrected partitioning for the multi-domain graphical model illustrated in FIG. 2C in accordance with an exemplary embodiment.

For example, time-driven component 272 of multi-domain graphical model 270 illustrated in FIG. 2C is a continuous time or discrete time controller. The output of PID (Proportional, Integral, Derivative) Controller block 272 is a weighted sum of the input signal, the integral of the input signal, and the derivative of the input signal. The weights are the proportional, integral, and derivative gain parameters. PID controller block 272 is not a polymorphic block and only operates in the time domain. Accordingly, PID controller block 272 cannot be included in a subgraph that executes in an event domain. However, as illustrated by gateway blocks 230, 232, 234, multi-domain graphical model 270 illustrated in FIG. 2C attempts to include PID controller block 272 in a subgraph. In this situation, the modeling and simulation environment may generate an error report to the user requesting a correction. Alternatively, the modeling and simulation environment may correct the error by removing PID controller block 272 from the identified subgraph as illustrated in FIG. 2D. The corrected grouping results in subgraph 290 and the time-driven components provided at the input and output of subgraph 290.

As further illustrated in FIG. 2D, the user or the modeling and simulation environment corrects the use of the gateways. Since time-driven PID controller block 272 cannot be executed in the event domain, gateway 232 designates a crossing (transition) from the event domain to the time domain. When the time-driven components execute in the time domain, the generated output is provided as an input to event-driven output switch block 218 and gateway 236 designates a crossing (transition) from the time domain to the event domain.

FIG. 3A illustrates another exemplary multi-domain graphical model 300 that includes time-driven components 308, 316; two groups of event-driven components 304, 312; and gateway components 302, 306, 310, 314 that designate the crossing between the time domain and the event domain. The first group of event-driven components 304 is automatically identified as first subgraph 318 by the modeling and simulation environment. Gateway block 302 designates the input of first subgraph 318 and gateway block 306 designates the output of first subgraph 318. The second group of event-driven components 312 is automatically identified as second subgraph 320 by the modeling and simulation environment. Gateway block 310 designates the input of second subgraph 320 and gateway block 314 designates the output of second subgraph 320. The modeling and simulation environment automatically identifies all the subgraphs in a given multi-domain graphical model. Multi-domain graphical model 300 illustrated in FIG. 3A has two subgraphs.

As illustrated in FIG. 3B, first subgraph 318 is replaced by first subgraph block 322 in transformed graphical model 350 that is only visible to the modeling and simulation environment, i.e. transformed graphical model 350 is not visible to the user. Similarly, second subgraph 312 is replaced by second subgraph block 324 in transformed graphical model 350. As such, multi-domain graphical model 300 illustrated in FIG. 3A may be represented using transformed graphical model 350 in the compiled block list. Transformed graphical model 350 is a multi-domain graphical model that includes time-driven components 308, 316 and event-driven subgraph components 322 and 324. The first group of event-driven components 318 and the second group of event-driven components 320 are simulated using subgraphs blocks 322 and 324, respectively.

As illustrated in FIGS. 3A-3B, there may be more than one subgraph in a multi-domain graphical model. The two subgraphs of FIGS. 3A-3B are identified during the compilation of the multi-domain graphical model 300. Subgraph blocks 322, 324 serve as the interface between the time-driven simulation and the event-driven simulation. Each of identified subgraphs 322, 324 is configured with properties that satisfy all the requirements of the time-driven simulation. Each of identified subgraphs 322, 324 has an independent event calendar that controls the execution of the event-driven components included in the associated subgraph.

Figure 3C:
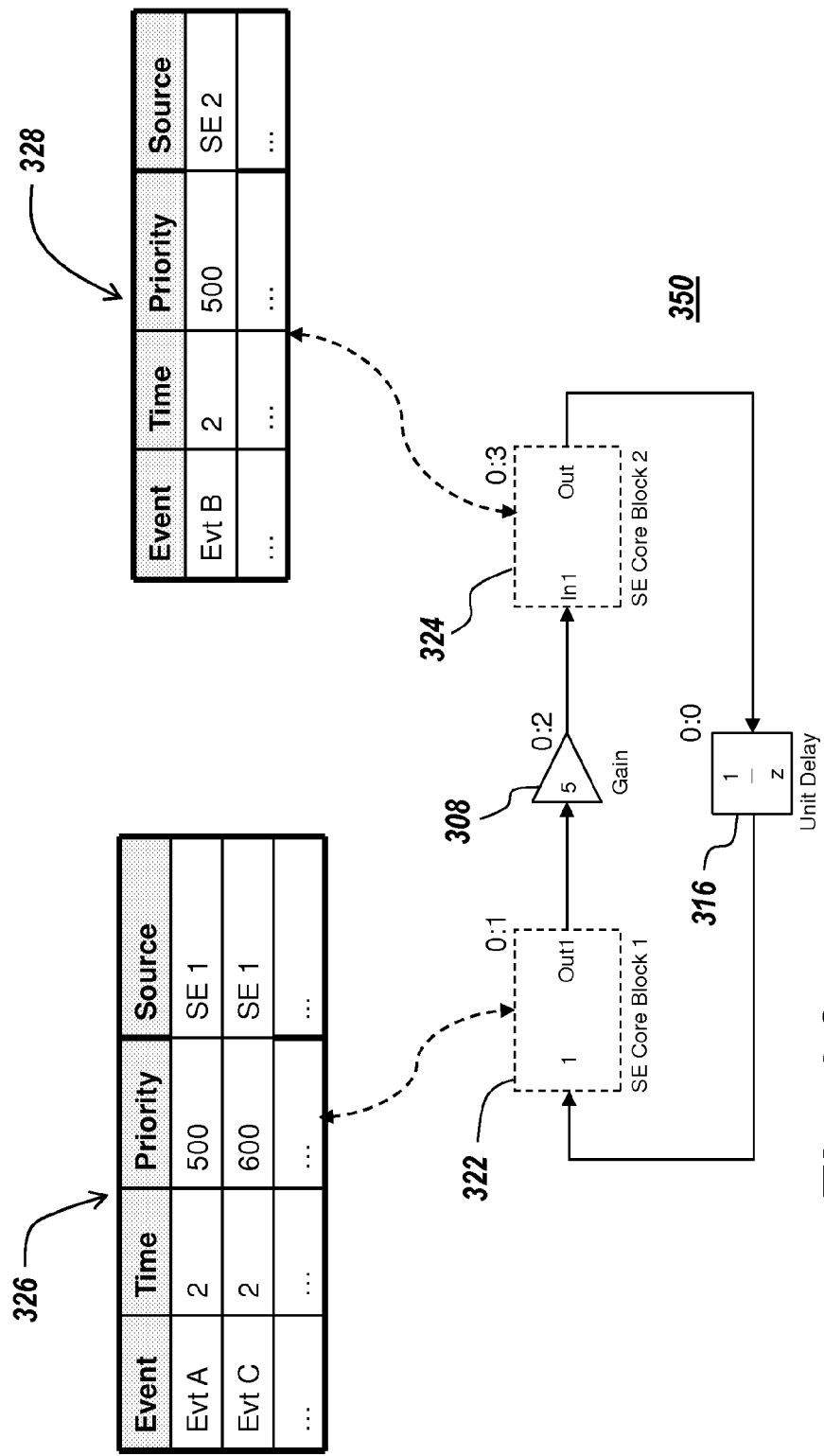
FIG. 3C illustrates the exemplary event calendars associated with the subgraphs of FIG. 3B.

As was mentioned above, a separate event calendar may be used for each subgraph of event-driven components. FIG. 3C illustrates independent event calendars 326, 328 associated with each subgraph 322, 324, respectively. FIG. 3C also illustrated the execution sequence of the components at a given simulation clock time. For example, the labels in the form of "0:0; 0:1 and 0:2" indicates execution sequence of the components at time t=2. That is, FIG. 3C illustrates the simulation steps for each component of transformed graphical model 350 at simulation time t=2. At time t=2, first unit delay block 316 executes. Then, the first group of event-driven components illustrated by first subgraph block 322 executes. That is, in this simulation step, the simulation is controlled by the event-driven modeling and simulation environment. Events A and C illustrated in event calendar 326 of first subgraph block 322 are executed. When the execution of first subgraph 322 is completed, the modeling and simulation environment is controlled by the time-driven modeling and simulation environment, and time-driven gain block 308 is executed. After gain block 308 executes, the event-driven modeling and simulation environment assumes the control of the simulation and second subgraph block 324 is called. That is, event B illustrated in event calendar 328 of second subgraph block 324 is executed. During the simulation of the multi-domain graphical model, the transitions between the event-driven modeling and simulation environment and the time-driven modeling and simulation environment are automatic and do not require a user input or control.

In a multi-domain graphical model, different subgraphs may have different configurations. According to an exemplary embodiment, a first subgraph may have a different sampling frequency than a second subgraph. According to yet another exemplary embodiment, the first subgraph may have a continuous sample time while the second subgraph may have a discrete sample time. The multiple subgraph and multiple event calendar design gives the modeling and simulation environment the capability to configure and simulate each of the subgraphs independently. One or ordinary skill in the art would appreciate that this ability is important when each subgraph represents an independent component of a dynamic system.

Figure 4:
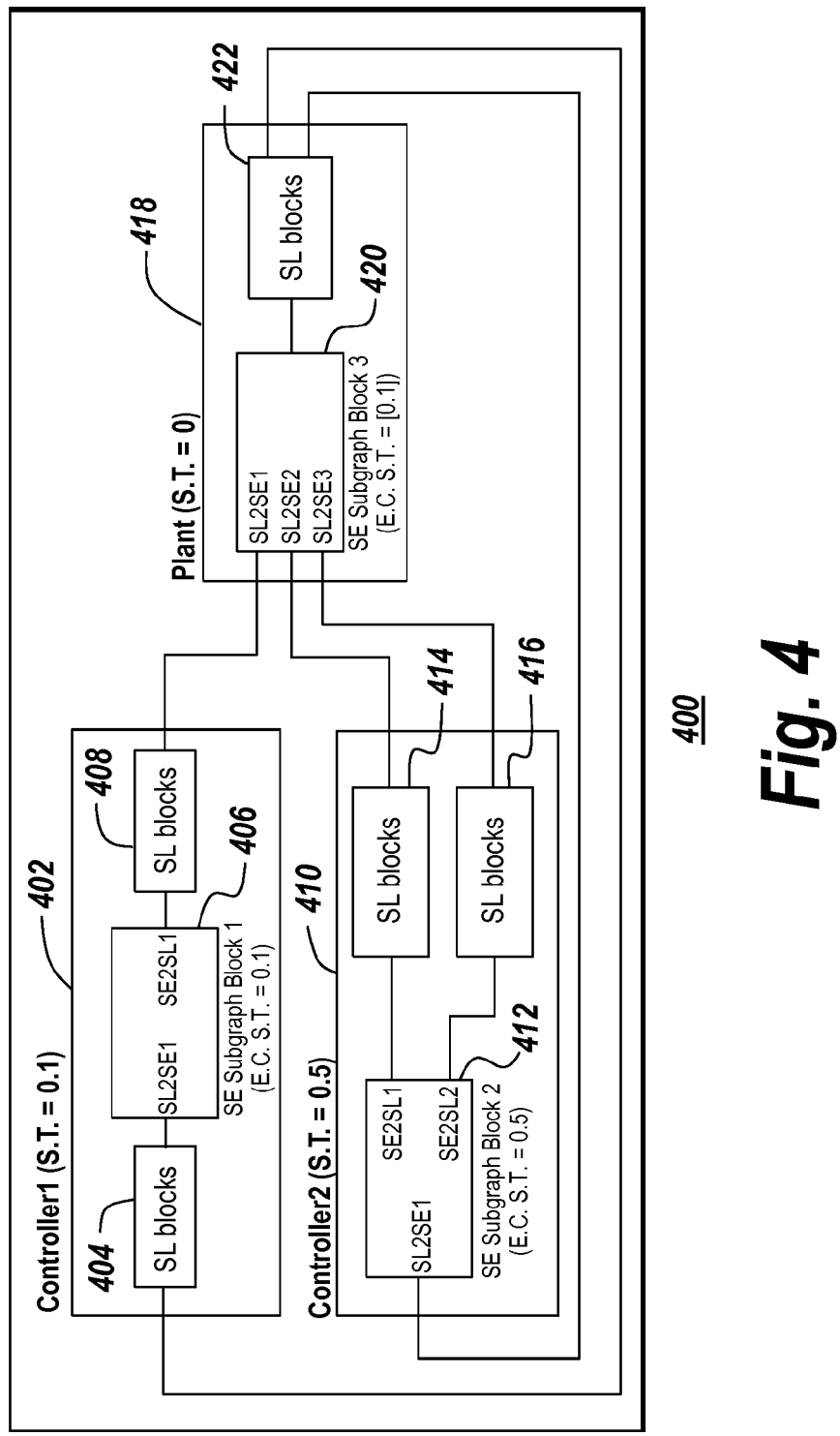
FIG. 4 illustrates an exemplary transformed model including a plurality of subgraphs.

FIG. 4 illustrates a transformed graphical model 400 of a multi-domain graphical model that represents a control system with three subsystems: two controllers 402, 410 and a plant 418. During the compilation of the multi-domain graphical model, three subgraphs are identified. The identified subgraphs are replaced by subgraph blocks 406, 412, 420 in the compiled block list and transformed graphical model 400 is generated for use of the modeling and simulation environment. As illustrated in FIG. 4, each of sub-systems 402, 410, 418 include a plurality of time-driven components and subgraphs. For example first controller 402 includes time-driven components 404, 408 and subgraph block 406. Second controller 410 includes subgraph block 412 and time-driven components 414, 416. The plant includes subgraph block 420 and time-driven component 422. As indicated above, each subgraph 406, 412, 420 includes one or more event-driven components. Similarly, each time-driven component 404, 408, 414, 416, 422 may comprise one or more time-driven components. As further illustrated in FIG. 4, some of the components of multi-domain graphical model 400 may have a plurality of outputs, e.g. subgraph block 412, or a plurality of inputs, e.g. subgraph block 420.

Subgraphs blocks 406, 412, 420 illustrated in FIG. 4 all have different configurations, i.e. different settings. For example, subgraph block 406 of first controller 402 runs under a sample time s.t.=0.1 (with a sampling frequency of 1/0.1=10 Hz) while subgraph block 412 of second controller 410 runs under a sample time s.t.=0.5 (with a sampling frequency of 1/0.5=2 Hz). That is, subgraph blocks 406, 412 are configured to have discrete sample time with different sampling frequencies. On the other hand, subgraph block 420 of plant 418 is configured to have continuous sample time. Using the multiple event calendar design, it is possible for the modeling and simulation environment to configure and simulate each subgraph block 406, 412, 420 independently.

The multiple subgraph and multiple event calendar design provides additional advantages during the code generation stage. Each of the subgraphs identified in a multi-domain graphical model may have different requirements during code generation. Some subgraphs may require code generation support while code may already be provided by the modeling and simulation environment for some subgraphs. For example, in the exemplary embodiment illustrated in FIG. 4, subgraph block 420 of plant 418 may not require code generation support because plant block 418 already includes code generated for itself. On the other hand, subgraph block 406 of first controller 402 and subgraph block 412 of second controller 410 may require code generation support. The generated code may be divided in separate tasks and deployed to separate microprocessors. The multiple subgraph and multiple event calendar design enables the modeling and simulation environment to generate and deploy code independently for each of the identified subgraphs.

Figure 5:
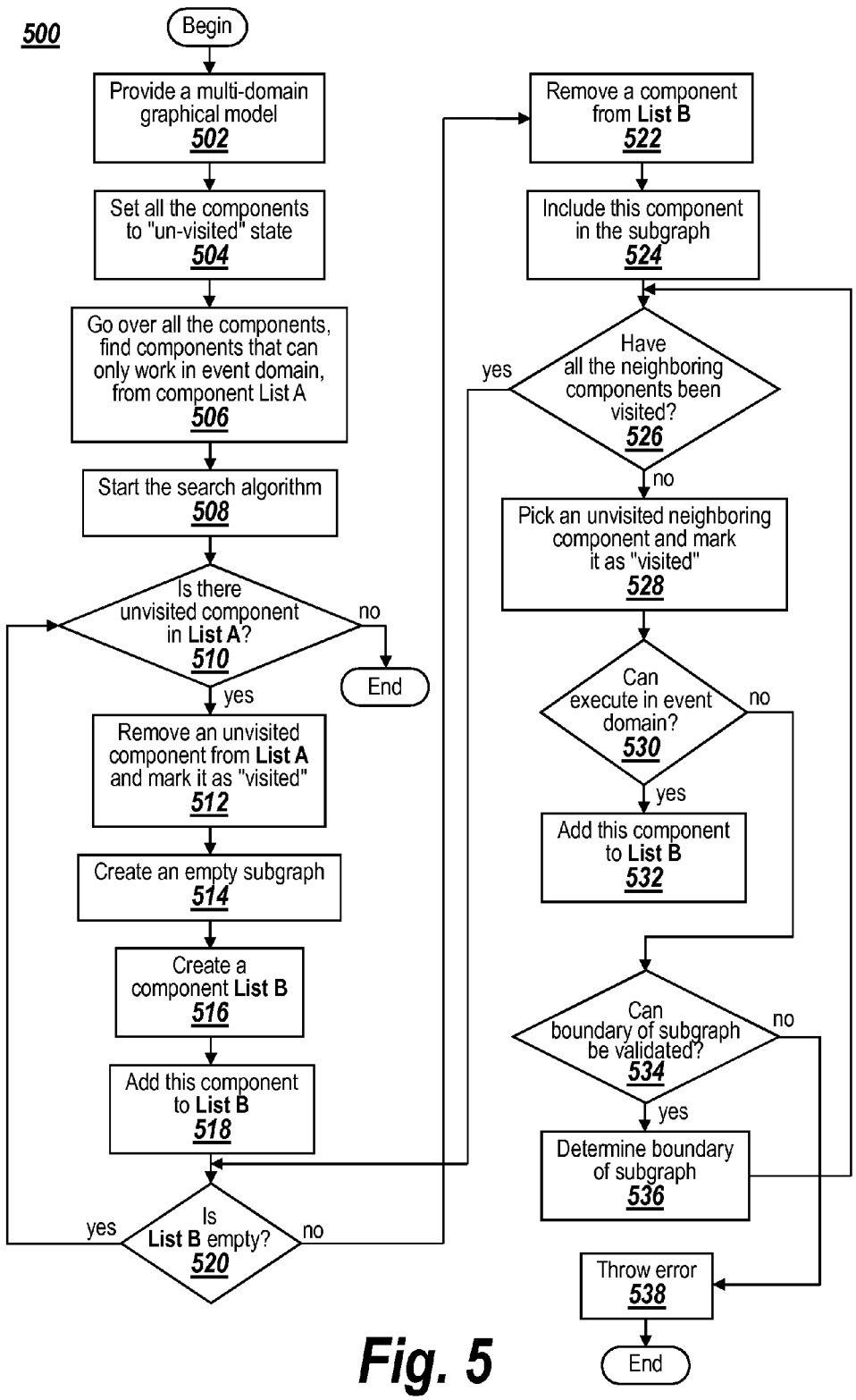
FIG. 5 illustrates a flowchart describing processing for partitioning a multi-domain graphical component into a plurality of subgraphs in accordance with an exemplary embodiment.

FIG. 5 illustrates a flowchart 500 describing the steps of partitioning a multi-domain graphical model into a plurality of subgraphs in accordance with an exemplary embodiment of the present application. A multi-domain graphical model comprising a plurality of time-domain components and a plurality of event-domain components is provided (step 502). One of ordinary skill in the art would appreciate that the use of time and event domain are for illustrative purposes. The steps of the flowchart 500 may be used with any two different domains. All the components are set to an "un-visited" state to indicate that none of the components has been analyzed (step 504). The components of the multi-domain graphical model are identified based on their execution environments. For example, all event-domain components of the multi-domain graphical model that are configured to execute only in the event domain are grouped into a component list, e.g. List A (step 506). Once the components are identified based on their execution environments, the modeling and simulation environment starts analyzing the components of the multi-domain graphical model, for example, using a search algorithm (step 508).

The search algorithm starts the analysis with a component of the multi-domain graphical model and continues until all components are analyzed. To make sure that all components are analyzed, the search algorithm checks whether there are unvisited, i.e. unanalyzed, components in the List A (step 510). If the answer to step 510 is no, the search algorithm completes execution. If the answer to step 510 is yes, the search algorithm picks an unvisited component and analyzes the selected component. That is, the search algorithm removes an unvisited component from List A and marks the selected component as "visited" (step 512). The search algorithm then creates an empty subgraph (step 514). The search algorithm also creates component List B (step 516). The selected component that is marked "visited" is added to the List B (step 518).

The search algorithm checks whether List B is populated (step 520). If List B is empty, the search algorithm returns to step 510. If there is a component in List B, the component is removed from List B (step 522) and included in the subgraph (step 524). To determine the boundaries of the subgraph, all neighboring components of the selected component need to be analyzed. Accordingly, the search algorithm checks whether all the neighboring components of the selected component have been visited (step 526). If all the neighboring components have been visited, i.e. have been analyzed, the search algorithm returns to step 520. If there are unanalyzed neighboring components, the search algorithm picks an unvisited neighboring component and marks it as "visited" (step 528). The search algorithm analyzes the neighboring component to determine whether the component can execute in the event domain (Step 530). If the component is determined to be capable of executing in the event domain, the component in added to List B (step 532). If it is determined that the component cannot execute in the event domain, the search algorithm checks whether the boundary of the subgraph can be validated such as to exclude the neighboring component that cannot execute in the event domain (step 534). If the boundary of the subgraph cannot be validated, the search algorithm generates an error message (step 538) and completes the analysis. If the boundary of the subgraph can be validated, the search algorithm determined the boundary of the subgraph (step 536) and returns to step (526).

Figure 6A:
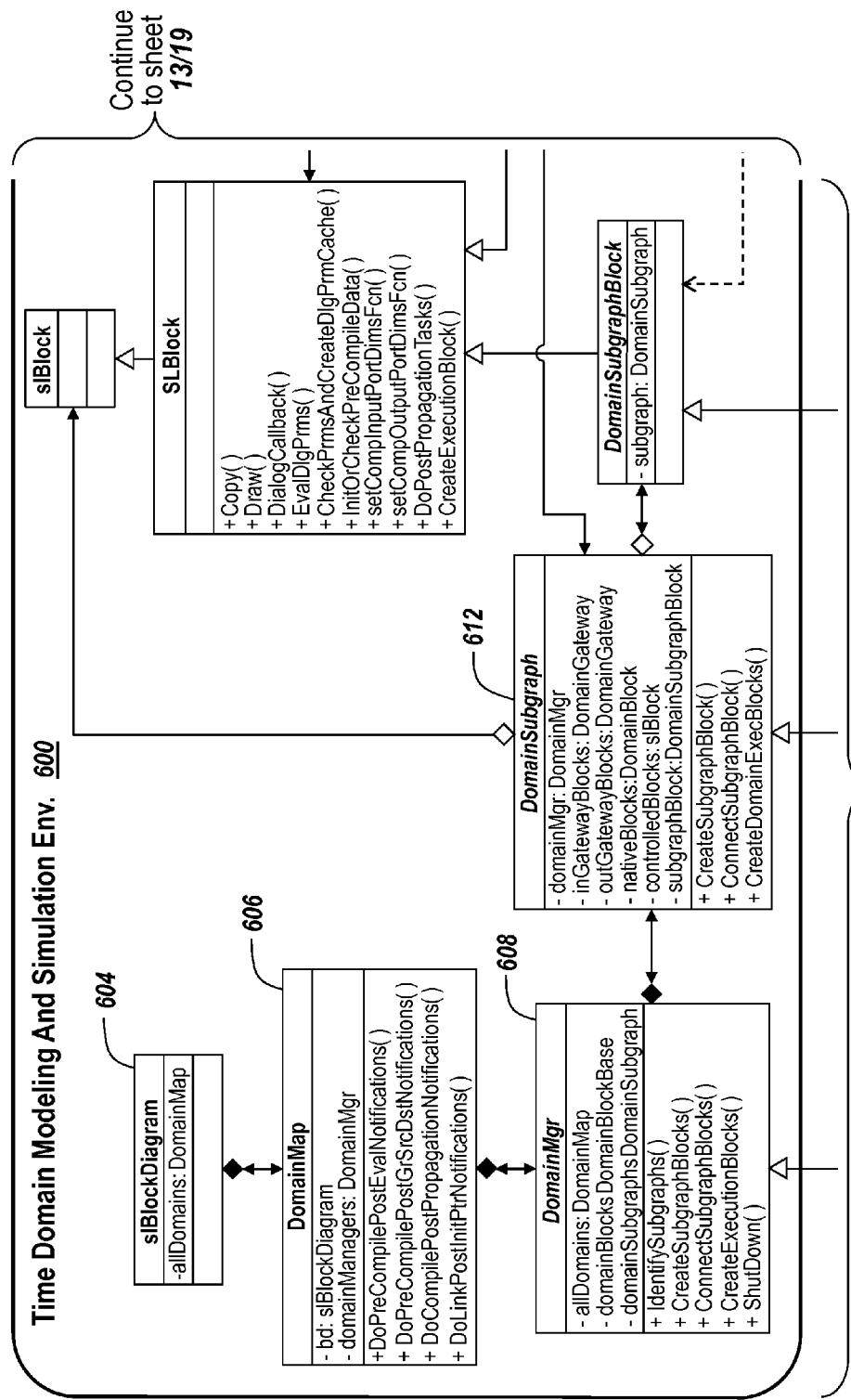
FIG. 6A illustrates an exemplary interaction between a time domain modeling and simulation environment and an event domain modeling and simulation environment in accordance with exemplary embodiments.
Figure 6A:
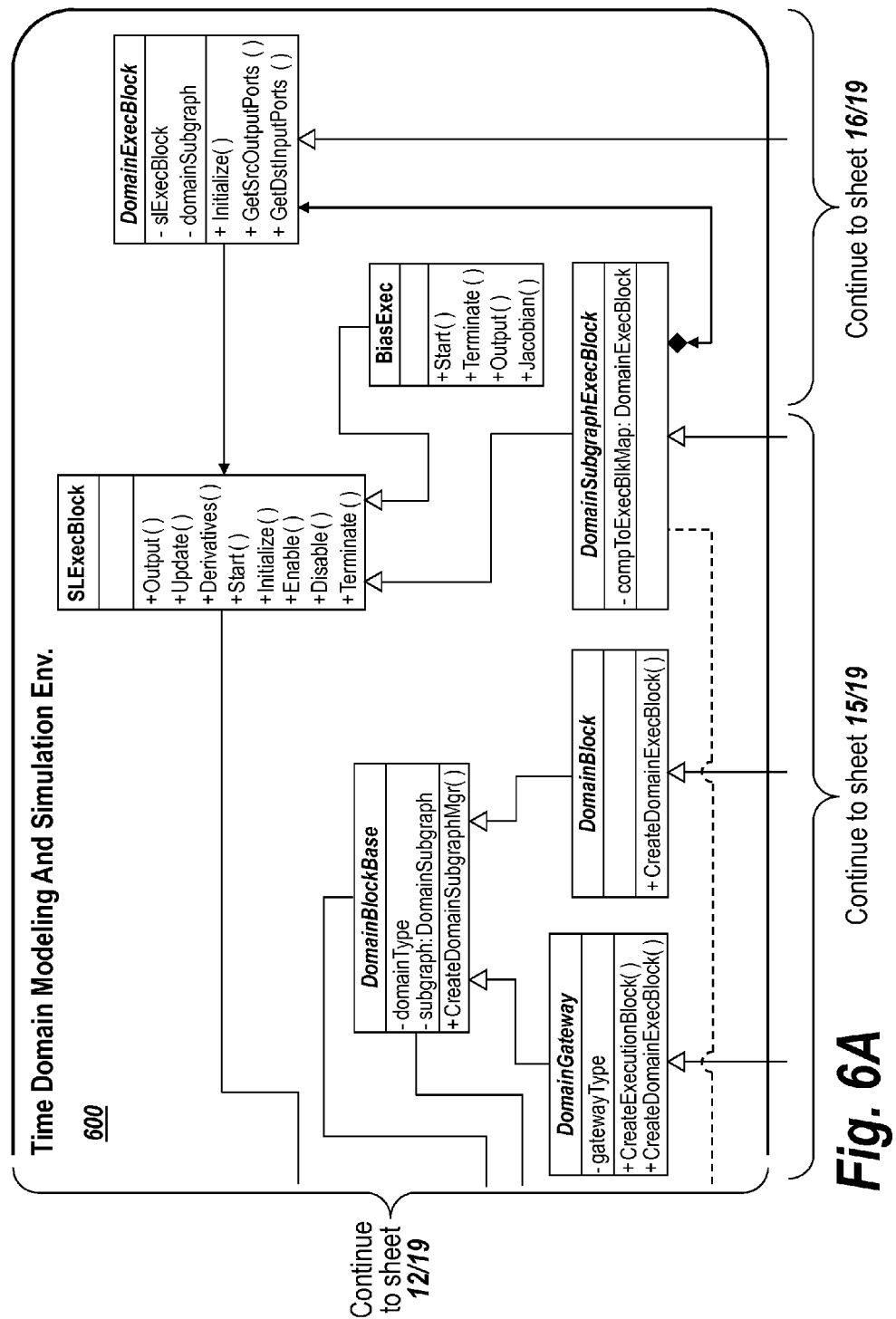
Figure 6A:
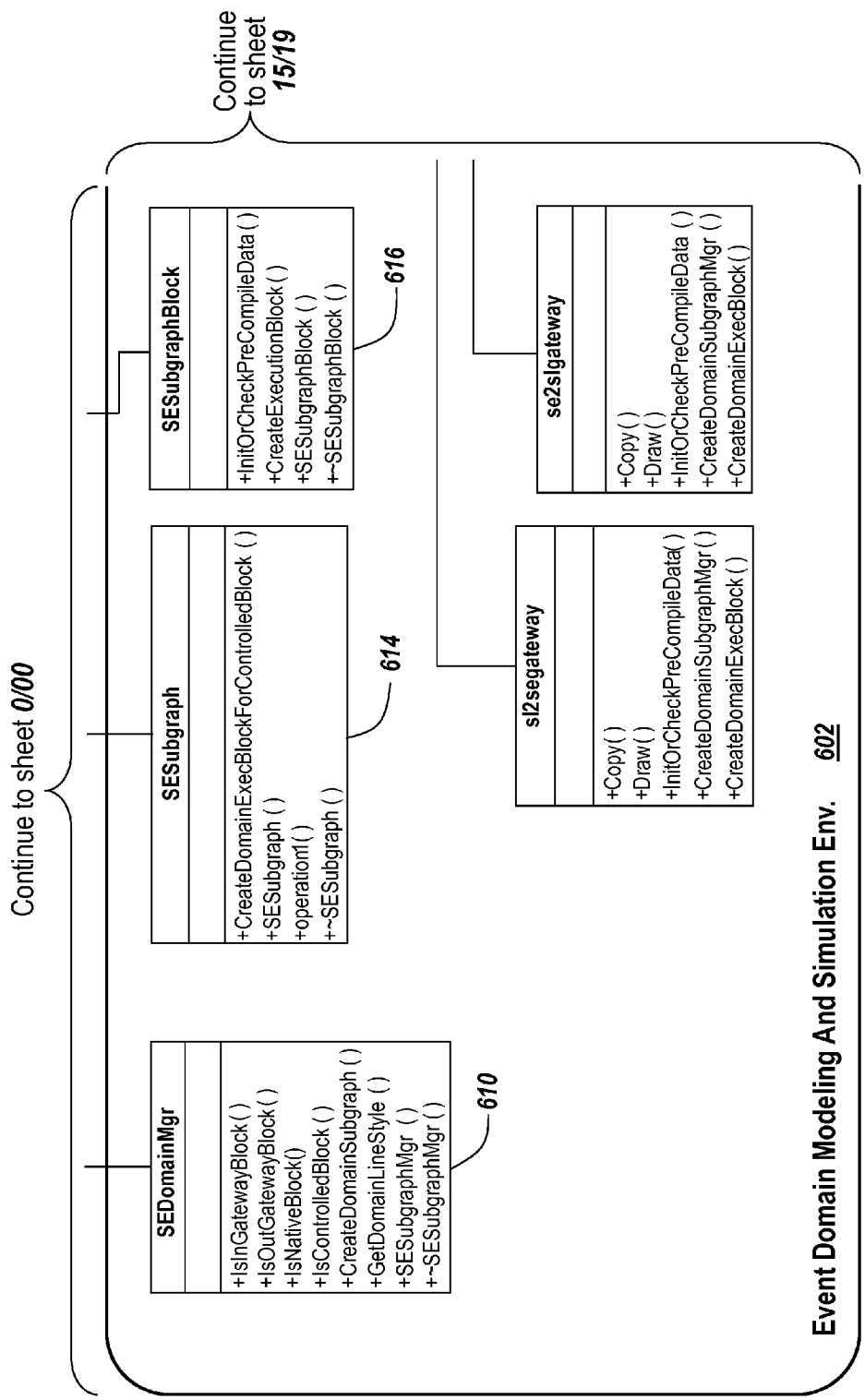
Figure 6A:
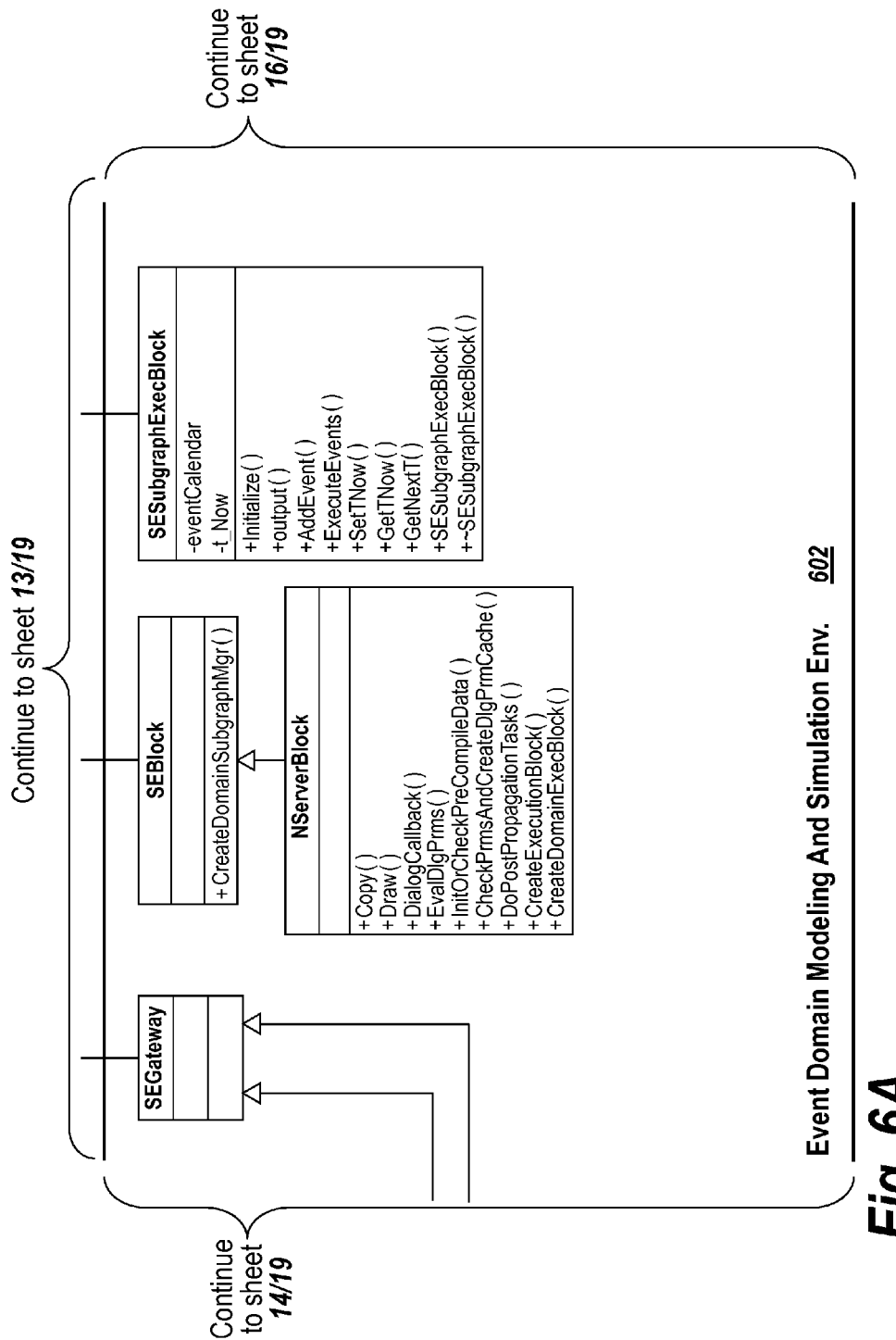
Figure 6A:
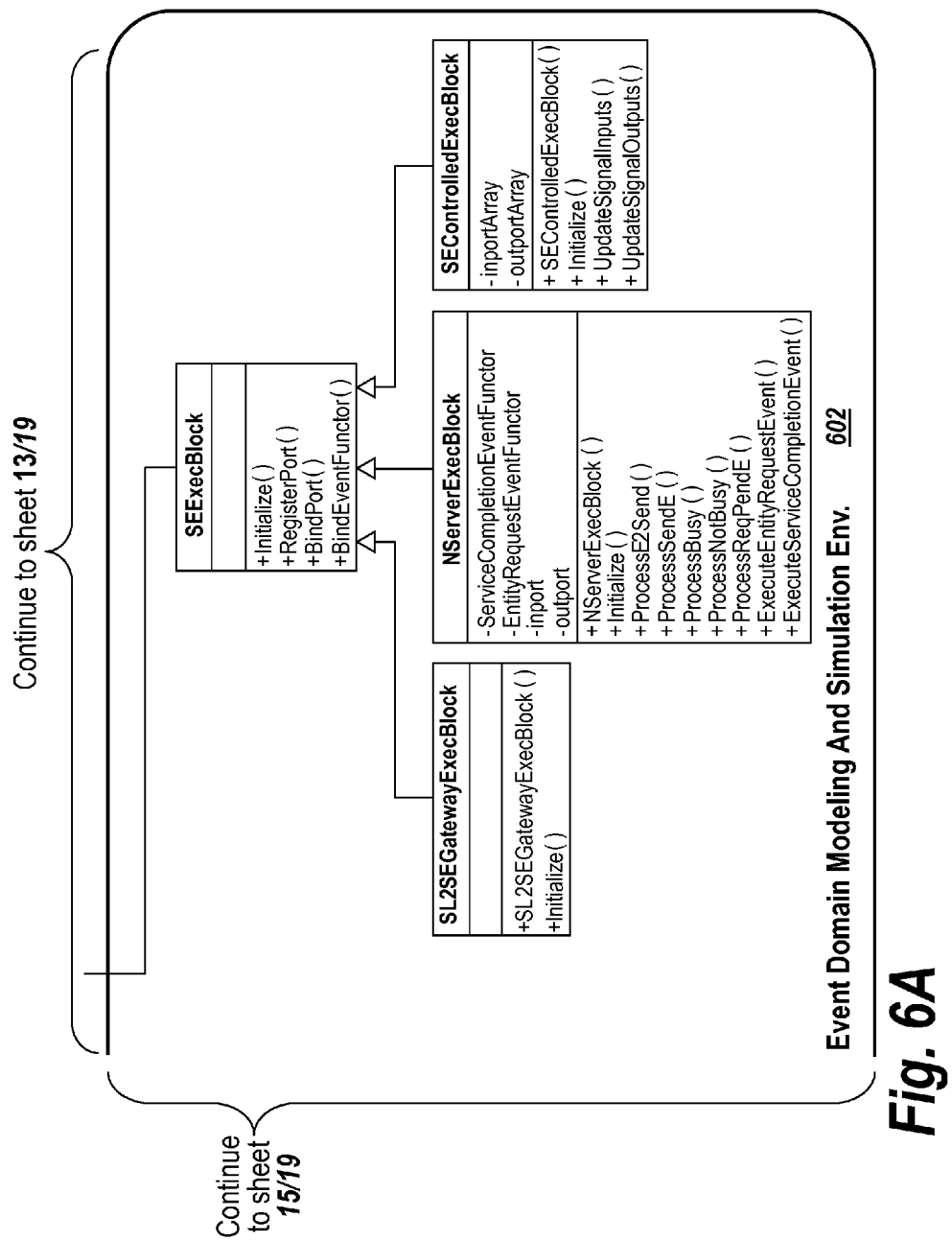

FIG. 6A illustrates an exemplary interaction between a time domain modeling and simulation environment 600 and an event domain modeling and simulation environment 602 in accordance with exemplary embodiments. The time domain modeling and simulation environment 600 includes a plurality of classes. Similarly, the event domain modeling and simulation environment 602 includes a plurality of classes. For example, class 604 is a class for a graphical model, such as a block diagram, generated in the time domain modeling and simulation environment. Class 604 is expanded to support domains other than the time domain in accordance with the exemplary embodiments described above.

Class 604 that represents, for example, a block diagram, may be associated with an object of class 606. Class 606 provides a look-up table that indicates all the non-time domains present in the block diagram. For example, if the block diagram has an event-driven component, there will be an entry for the event domain in the look-up table provided by class 606.

Each entry stored in class 606 has type 608. In a block diagram, an object with type 608 manages all the domain subgraphs and other domain related objects. Some domain management operations are domain specific. These domain specific operations are accomplished by class 608. For example, class 610 which provides event domain specific management operations is a sub-class of class 608. Class 608 is in charge of the identification, creation and removal of an object of class 612. An object of class 612 represents a domain subgraph. In a block diagram, the object of class 612 has unique serial number and name, and stores data such as list of domain blocks in this subgraph, list of polymorphic blocks in this subgraph, list of gateway blocks in this subgraph, subgraph configuration, etc. The object of class 612 supports compile and simulation activities related to a specific subgraph.

Some subgraph management operations are domain specific. The domain specific subgraph management operations are accomplished by sub-classing class 612. For example, class 614 is a sub-class of class 612. Class 614 defines event domain specific subgraph management operations.

Figure 6B:
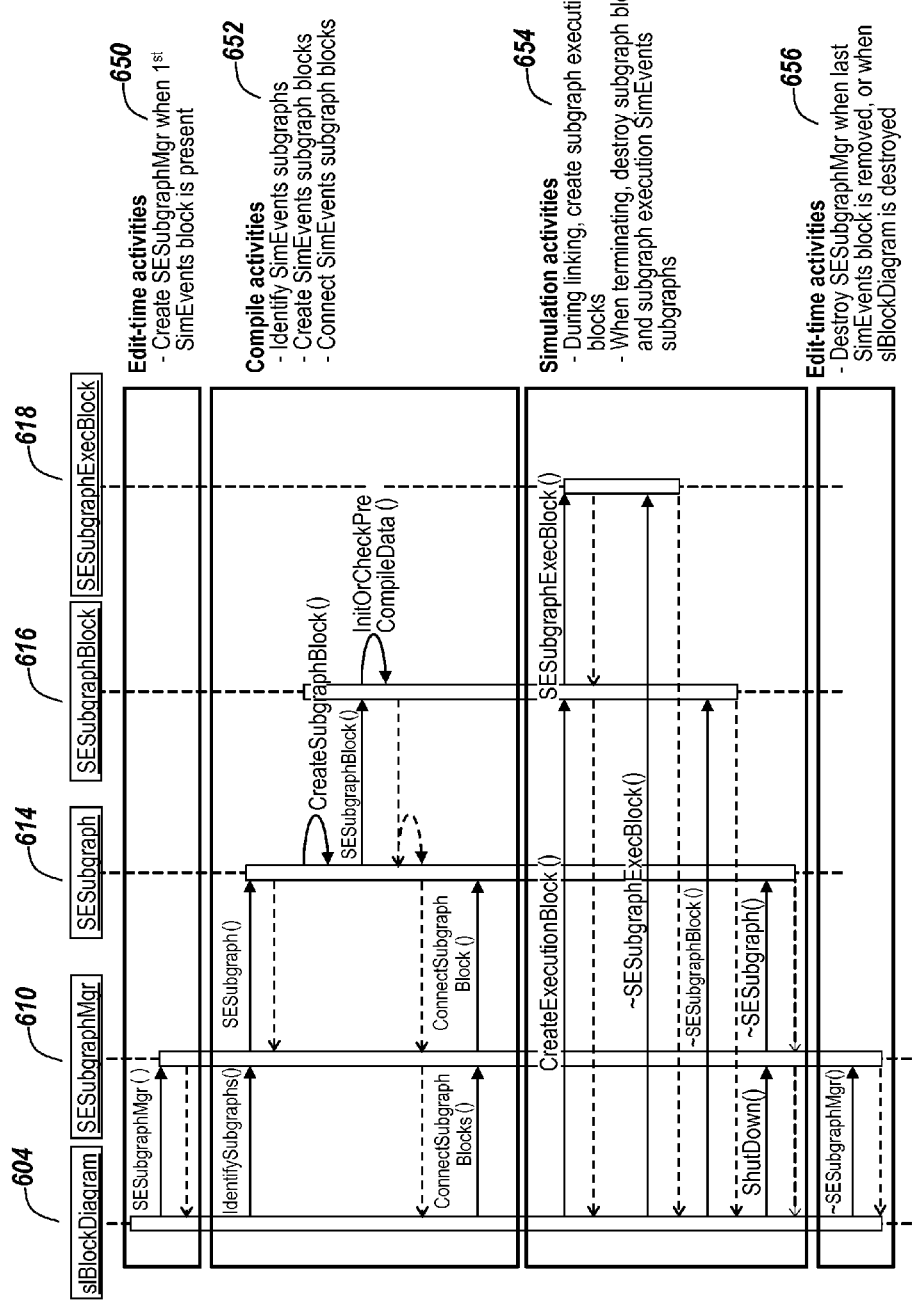
FIG. 6B illustrates an exemplary process of identifying, creating and removing a subgraph in a multi-domain graphical model.

FIG. 6B illustrates an exemplary process of identifying, creating and removing a subgraph in a multi-domain graphical model. As indicated above, modeling of a multi-domain graphical model can include four stages: editing, compiling, linking, and execution, i.e. simulation. FIG. 6B illustrates editing stage activities 650 and 656, compiling stage activities 652 and simulation stage activities associated with an exemplary multi-domain graphical model. According to the example illustrated in FIG. 6B, a user may be generating and/or editing a multi-domain graphical model in a time domain modeling and simulation environment during the editing stage 650 of the multi-domain graphical model. When the user places the first event-driven component in the multi-domain graphical model, an object of class 610 is created. This object of class 610 may maintain a block list that keeps track of all the event-driven components in the multi-domain graphical model. The object of class 610 may be removed when the last event-driven component is removed from the multi-domain graphical model.

During the compiling stage 652 of the multi-domain graphical model, each object 608 starts the subgraph identification process (described above) using the block list derived during the editing stage. Multi-domain graphical model transform operations, such as creation and connecting of a subgraph block, are also undertaken in the compiling stage.

During the simulation stage 654 of the multi-domain graphical model, an execution instance is created for the event-driven subgraph block. As described in detail above, an independent event-calendar is assigned to the execution instance of the event-driven subgraph block. The execution instance and the event-calendar support the execution of the event-driven subgraph during the simulation stage. At the end of the simulation, the event-driven subgraph block, its execution instance and the event-driven subgraph itself are removed from the simulation environment.

Figure 7:
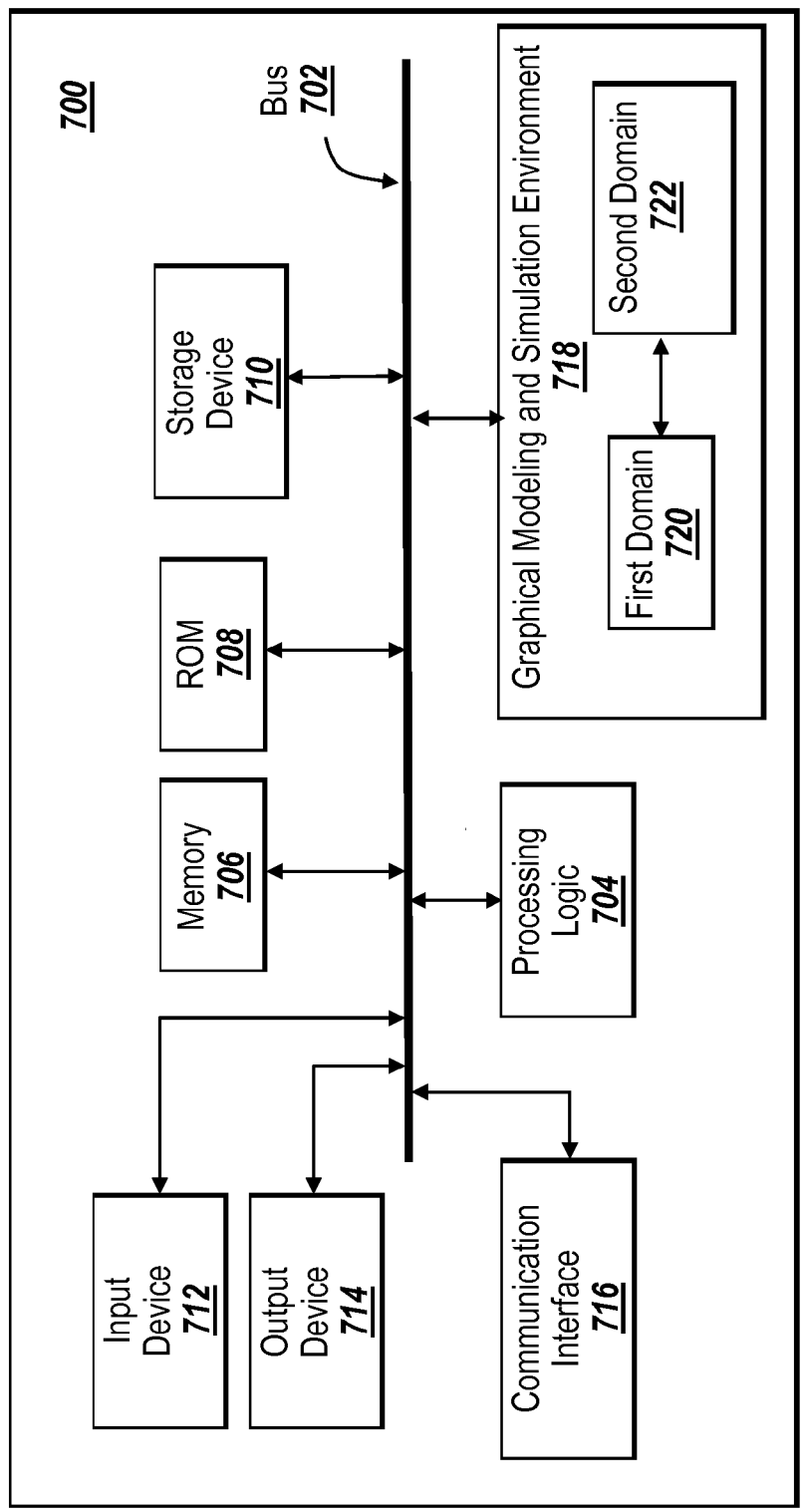
FIG. 7 illustrates an exemplary computing device that may be used to implement the illustrative embodiments described herein.

FIG. 7 illustrates an exemplary computer architecture 700 that can be used to implement the illustrative embodiments discussed above. FIG. 7 is an exemplary diagram of a computing device 700 that includes a bus 702, processing logic 704, a main memory 706, a read-only memory (ROM) 708, a storage device 710, an input device 712, an output device 714, and/or a communication interface 716. Bus 702 may include a path that permits communication among the components of the computing device 700.

Processing logic 704 may include a processor, microprocessor, or other types of processing logic that may interpret and execute instructions. In one implementation, processing logic 704 may include a single core processor or a multi-core processor. In another implementation, processing logic 704 may include a single processing device or a group of processing devices, such as a processor cluster or computing grid. In still another implementation, processing logic 704 may include multiple processors that may be local or remote with respect each other, and may use one or more threads while processing.

Main memory 706 may include a random access memory (RAM) or another type of dynamic storage device that may store information and instructions for execution by processing logic 704. ROM 708 may include a ROM device or another type of static storage device that may store static information and/or instructions for use by processing logic 704. Storage device 710 may include a magnetic, solid state and/or optical recording medium and its corresponding drive, or another type of static storage device that may store static information and/or instructions for use by processing logic 704.

Input device 712 may include logic that permits an operator to input information to the entity, such as a keyboard, a mouse, a pen, a touchpad, an accelerometer, a microphone, voice recognition, camera, neural interface, biometric mechanisms, etc. Output device 714 may include a mechanism that outputs information to the operator, including a display, a printer, a speaker, etc. Communication interface 716 may include any transceiver-like logic that enables the entity to communicate with other devices and/or systems. For example, communication interface 716 may include mechanisms for communicating with another device or system via a network.

The computing device 700 depicted in FIG. 7 may perform certain operations in response to processing logic 704 executing software instructions contained in a tangible computer-readable medium, such as main memory 706. A tangible computer-readable medium may be defined as a physical or logical memory device. The software instructions may be read into main memory 706 from another computer-readable storage medium, such as storage device 710, or from another device via communication interface 716. The software instructions contained in main memory 706 may cause processing logic 704 to perform processes described herein when the software instructions are executed on processing logic. Alternatively, hardwired circuitry may be used in place of or in combination with software instructions to implement processes described herein. Thus, implementations described herein are not limited to any specific combination of hardware circuitry and software.

As illustrated in FIG. 7, the computing device 700 may include a graphical modeling and simulation environment 718. The graphical modeling and simulation environment 700 may include multi-domain graphical modeling and simulation environments to support multi-domain graphical models. For example, the graphical modeling and simulation environment 718 may include a first domain graphical modeling and simulation environment 720 and a second domain graphical modeling and simulation environment 722. According to various embodiments, the first domain graphical modeling and simulation environment 720 may be a time domain graphical modeling and simulation environment. According to various embodiments, the second domain graphical modeling and simulation environment 722 may be an event domain graphical modeling and simulation environment. The first domain graphical modeling and simulation environment 720 may communicate with the second domain graphical modeling and simulation environment 722 when simulating a multi-domain graphical model as discussed above.

Although FIG. 7 shows exemplary components of the computing device, in other implementations, the computing device 700 may contain fewer, different, or additional components than depicted in FIG. 7. In still other implementations, one or more components of the entity may perform one or more tasks described as being performed by one or more other components of the computing device 700.

Figure 8:
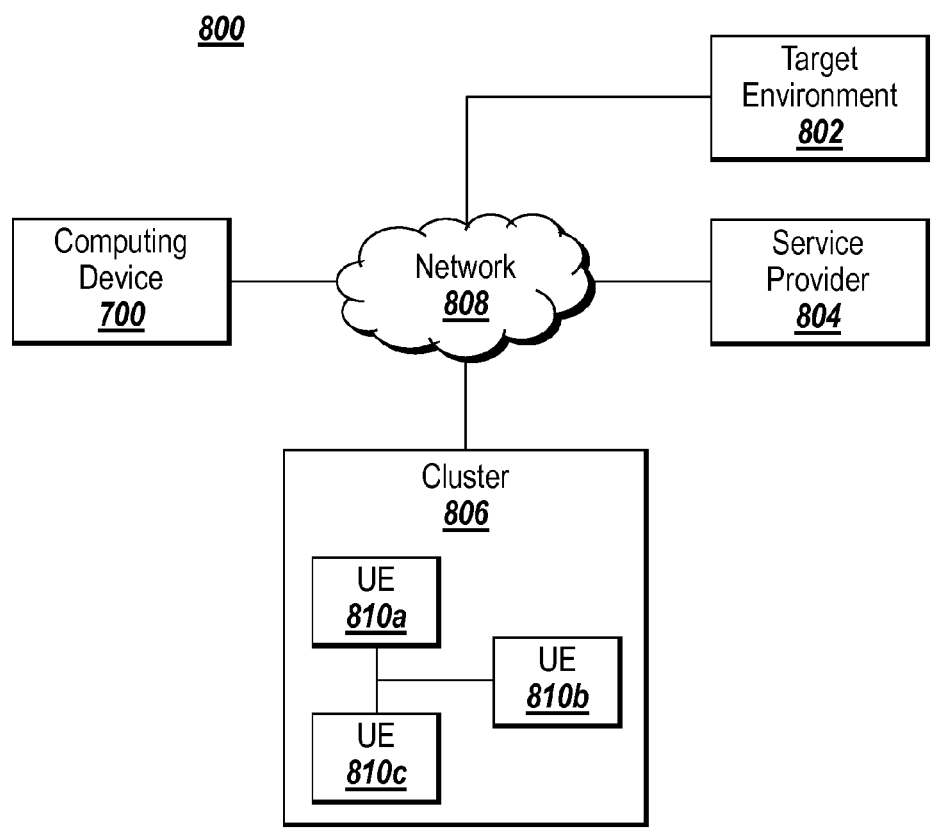
FIG. 8 illustrates a distributed computing environment that may be used to implement the illustrative embodiments described herein.

One or more embodiments of the invention may be implemented in a distributed environment. FIG. 8 illustrates an example of a distributed environment 800 that may be configured to implement one or more embodiments of the invention. Referring to FIG. 8, environment 800 may contain various entities including computing device 700, target environment 802, service provider 804, cluster 806, and network 808. Note that the distributed environment 800 is just one example of a distributed environment that may be used with the illustrative embodiments discussed above. Other distributed environments that may be used with the illustrative embodiments may contain more computing devices, fewer computing devices, computing devices in arrangements that differ from the arrangement illustrated in FIG. 8. Moreover, the distributed environments may be configured to implement various cloud computing frameworks.

Details of computing device 700 were described above with respect to FIG. 7. In distributed environment 800, computing device 700 may be configured to, among other things, exchange information (e.g., data) with other entities on network 808 (e.g., target environment 802, service provider 804, and cluster 806). Computing device 700 may interface with the network 808 via a communication interface.

Target environment 802 may be configured to execute and/or interpret a compiled version of a model, e.g. a multi-domain graphical model, which may be generated in or otherwise available to the distributed environment 800. The network 808 may include a communication network capable of exchanging information between the entities in the network 808. The network 808 may include digital and/or analog aspects. The information may include machine-readable information having a format that may be adapted for use, for example, in the network 808 and/or with one or more entities in the network 808. For example, the information may be encapsulated in one or more packets that may be used to transfer the information through the network 808.

Information may be exchanged between entities using various network protocols, such as, but not limited to, the Internet Protocol (IP), Asynchronous Transfer Mode (ATM), Synchronous Optical Network (SONET), the User Datagram Protocol (UDP), Transmission Control Protocol (TCP), Institute of Electrical and Electronics Engineers (IEEE) 802.11, etc.

The network 808 may include various network devices, such as gateways, routers, switches, firewalls, servers, repeaters, address translators, etc. Portions of the network 808 may be wired (e.g., using wired conductors, optical fibers, etc.) and/or wireless (e.g., using free-space optical (FSO), radio frequency (RF), acoustic transmission paths, etc.). Portions of network 808 may include a substantially open public network, such as the Internet. Portions of network 808 may include a more restricted network, such as a private corporate network or virtual private network (VPN).

It should be noted that implementations of networks and/or devices operating on networks described herein are not limited with regards to, for example, information carried by the networks, protocols used in the networks, and/or the architecture/configuration of the networks.

Service provider 804 may include logic that makes a service available to another entity in the distributed environment 800. Service provider 804 may also include a server operated by, for example, an individual, a corporation, an educational institution, a government agency, and so on, that provides one or more services to a destination, such as computing device 700. The services may include software containing computer-executable instructions that implement one or more embodiments of the invention or portions thereof, and may be executed, in whole or in part, by (1) a destination, (2) the service provider 704 on behalf of the destination, or (3) some combination thereof.

For example, in an embodiment, service provider 804 may provide one or more subscription-based services that may be available to various customers. The services may be accessed by a customer via network 808. The customer may access the services using a computer system, such as computing device 700. The services may include services that implement one or more of the illustrative embodiments discussed above or portions thereof. Service provider 804 may limit access to certain services based on, e.g., a customer service agreement between the customer and service provider 804.

The service agreement may allow the customer to access the services that may allow the customer to build, execute, and/or analyze a model, such a multi-domain graphical model, as described above. The service agreement may include other types of arrangements, such as certain fee-based arrangements or restricted access arrangements. For example, a customer may pay a fee which provides the customer unlimited access to a given package of services for a given time period (e.g., per minute, hourly, daily, monthly, yearly, etc.). For services not included in the package, the customer may have to pay an additional fee in order to access the services. Still other arrangements may be resource-usage based. For example, the customer may be assessed a fee based on an amount of computing resources and/or network bandwidth used.

Cluster 806 may include a number of units of execution (UEs) 810 that may perform processing of one or more embodiments of the invention or portions thereof on behalf of computing device 700 and/or another entity, such as service provider 804. The UEs 810 may reside on a single device or chip or on multiple devices or chips. For example, the UEs 810 may be implemented in a single ASIC or in multiple ASICs Likewise, the UEs 810 may be implemented in a single computer system or multiple computer systems. Other examples of UEs 810 may include FPGAs, CPLDs, ASIPs, processors, multiprocessor systems-on-chip (MPSoCs), graphic processing units, microprocessors, etc. The UEs 810 may be configured to perform operations on behalf of another entity.

Exemplary embodiments may include or may be implemented in a technical computing environment that includes hardware and/or hardware-software based logic. The logic may provide a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

In one implementation, the technical computing environment may include a dynamically typed language that can be used to express problems and/or solutions in mathematical notations familiar to those of skill in the relevant arts. For example, the technical computing environment may use an array as a basic element, where the array may not require dimensioning. These arrays may be used to support array programming in that operations can apply to an entire set of values, such as values in an array. Array programming may allow array based operations to be treated as a high-level programming technique or model that lets a programmer think and operate on whole aggregations of data without having to resort to explicit loops of individual non-array, i.e., scalar operations.

The technical computing environment may further be adapted to perform matrix and/or vector formulations that can be used for data analysis, data visualization, application development, simulation, modeling, algorithm development, etc. These matrix and/or vector formulations may be used in many areas, such as statistics, finance, image processing, signal processing, control design, life sciences, education, discrete event analysis and/or design, state based analysis and/or design, etc.

The technical computing environment may further provide mathematical functions and/or graphical tools (e.g., for creating plots, surfaces, images, volumetric representations, etc.). In one implementation, the technical computing environment may provide these functions and/or tools using toolboxes (e.g., toolboxes for signal processing, image processing, data plotting, parallel processing, optimization, etc.). In another implementation, the technical computing environment may provide these functions as block sets (e.g., an optimization block set). In still another implementation, the technical computing environment may provide these functions in another way, such as via a library, etc. The technical computing environment may be implemented as a text based environment, a graphically based environment, or another type of environment, such as a hybrid environment that is both text and graphically based.

For example, a text-based embodiment may implement the technical computing environment using one or more text-based products. For example, a text-based technical computing environment (TCE), may be implemented using products such as, but not limited to, MATLAB® by The MathWorks, Inc.; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim; AnyLogic from XJ Technologies; the TrueTime freeware. The text-based TCE may support one or more commands that support remote processing using one or more units of execution or other types of remote processing devices.

A graphically-based embodiment may implement the technical computing environment in a graphically-based technical computing environment using products such as, but not limited to, Simulink®, Stateflow®, SimEvents™, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; Ptolemy from the University of California at Berkeley; or aspects of a Unified Modeling Language (UML) or SysML environment. The graphically-based TCE may support remote processing using one or more units of execution or other types of remote processing devices.

Implementations may provide a modeling environment that allows states to be implicitly reset while a model executes.

The foregoing description of exemplary illustrative embodiments provides illustration and description, but is not intended to be exhaustive or limiting to the precise form disclosed. Modifications and variations are possible in light of the above teachings.

In addition, implementations consistent with the foregoing principles can be implemented using devices and configurations other than those illustrated in the figures and described in the specification without departing from the spirit of the invention. Further, disclosed implementations may not be limited to any specific combination of hardware.

Further, certain portions of the invention may be implemented as "logic" that performs one or more functions. This logic may include hardware, such as hardwired logic, an application-specific integrated circuit, a field programmable gate array, a microprocessor, software, or a combination of hardware and software.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

Headings and sub-headings used herein are to aid the reader by dividing the specification into subsections. These headings and sub-headings are not to be construed as limiting the scope of the invention or as defining the invention.

The scope of the invention is defined by the claims and their equivalents.

What is claimed is:

1. A non-transitory computer-readable storage medium storing instructions for execution on a processor to execute a multi-domain graphical model, the medium storing instructions for:
   interacting with the multi-domain graphical model, where the multi-domain graphical model includes:
      one or more executable event-driven components operating in an event domain,
      one or more executable time-driven components operating in a time domain, and
      one or more gateway blocks;
   partitioning the multi-domain graphical model into a plurality of subgraphs using the one or more gateway blocks, two gateway blocks indicating boundaries of a subgraph, where the plurality of subgraphs includes:
      a first subgraph comprising:
         a first group of interconnected event-driven graphical components, and
      a second subgraph comprising:
         a second group of interconnected event-driven graphical components such that one or more time-driven components are provided between the first subgraph and the second subgraph;
   generating a transformed graphical model from the multi-domain graphical model, the transformed graphical model includes:
      a first graphical component that represents the first subgraph, and
      a second graphical component that represents the second subgraph; and
   using the transformed graphical model during execution of the multi-domain graphical model.

2. The medium of claim 1, wherein the first graphical component and the second graphical component execute in the time domain.

3. The medium of claim 1, wherein transformed model is invisible to the user.

4. The medium of claim 1 further storing instructions for:
   executing the multi-domain graphical model, the executing including:
      using a result of execution the first subgraph during execution of the one or more time-driven components provided between the first subgraph and the second subgraph, and
      using a result of execution the one or more time-driven components during execution of the second subgraph; and
   providing results of the execution of the multi-domain graphical model.

5. The medium of claim 1 further storing instructions for:
   associating the first subgraph with a first event calendar; and
   associating the second subgraph with a second event calendar.

6. The medium of claim 5, wherein the first subgraph is executed independent from the second subgraph by:
   executing components of the first subgraph using the first event calendar; and
   executing components of the second subgraph using the second event calendar.

7. The medium of claim 1, wherein the time domain is a continuous time domain.

8. The medium of claim 1, wherein the time domain is a discrete time domain.

9. The medium of claim 1, wherein one or more of the event-driven components are in a same level of a model hierarchy as one or more of the time-driven components in the multi-domain graphical model.

10. The medium of claim 1, wherein the first group of interconnected event-driven graphical components forming the first subgraph are provided at two levels of a model hierarchy.

11. The medium of claim 1, wherein the second group of interconnected event-driven graphical components forming the second subgraph are provided at two levels of a model hierarchy.

12. The medium of claim 1, where:
   the components of the first subgraph are identified on a representation of the multi-domain graphical model using a first set of visual cues; and
   the components of the second subgraph are identified on the representation the multi-domain graphical model using a second set of visual cues.

13. The medium of claim 1, wherein the first subgraph operates with settings that differ from settings used by the second subgraph.

14. The medium of claim 13, wherein the settings include sampling time.

15. The medium of claim 1 further storing instructions for:
   generating code for the multi-domain graphical model that includes the first subgraph and the second subgraph.

16. The medium of claim 15, wherein code for the first subgraph is generated independent from the code for the second subgraph.

17. The medium of claim 15, wherein the code for the first subgraph executes in a first target environment and the code for the second subgraph executes in a second target environment.

18. The medium of claim 1, wherein the first subgraph or the second subgraph includes a polymorphic block, the polymorphic block executable in a plurality of domains.

19. A computer-implemented method for executing a multi-domain graphical model, the method comprising:
   interacting with the multi-domain graphical model, where the multi-domain graphical model includes:
      one or more executable event-driven components operating in an event domain,
      one or more executable time-driven components operating in a time domain, and
      one or more gateway blocks;
   partitioning the multi-domain graphical model into a plurality of subgraphs using the one or more gateway blocks, two gateway blocks indicating boundaries of a subgraph, where the plurality of subgraphs includes:
      a first subgraph comprising:
         a first group of interconnected event-driven graphical components, and
      a second subgraph comprising:
         a second group of interconnected event-driven graphical components such that one or more time-driven components are provided between the first subgraph and the second subgraph;
   generating a transformed graphical model from the multi-domain graphical model, the transformed graphical model includes:
      a first graphical component that represents the first subgraph, and
      a second graphical component that represents the second subgraph; and using the transformed graphical model during execution of the multi-domain graphical model.

20. The method of claim 19, wherein the first graphical component and the second graphical component execute in the time domain.

21. The method of claim 19, wherein transformed model is invisible to the user.

22. The method of claim 19 further comprising:
executing the multi-domain graphical model, the executing including:
   using a result of execution the first subgraph during execution of the one or more time-driven components provided between the first subgraph and the second subgraph, and
   using a result of execution the one or more time-driven components during execution of the second subgraph; and
providing results of the execution of the multi-domain graphical model.

23. The method of claim 19 further comprising:
associating the first subgraph with a first event calendar; and
associating the second subgraph with a second event calendar.

24. The method of claim 23, wherein the first subgraph is executed independent from the second subgraph by:
   executing components of the first subgraph using the first event calendar; and
   executing components of the second subgraph using the second event calendar.

25. The method of claim 19, where:
the components of the first subgraph are identified on a representation of the multi-domain graphical model using a first set of visual cues; and
the components of the second subgraph are identified on the representation the multi-domain graphical model using a second set of visual cues.

* * * * *